(12) United States Patent
Gruar

(10) Patent No.: US 12,312,673 B2
(45) Date of Patent: May 27, 2025

(54) METHOD OF MANUFACTURING SOLID STATE BATTERY CATHODES FOR USE IN BATTERIES

(71) Applicant: Dyson Technology Limited, Wiltshire (GB)

(72) Inventor: Robert Ian Joseph Gruar, Swindon (GB)

(73) Assignee: Dyson Technology Limited, Malmesbury (GB)

( * ) Notice: Subject to any disclaimer, the term of this patent is extended or adjusted under 35 U.S.C. 154(b) by 126 days.

(21) Appl. No.: 17/775,129

(22) PCT Filed: Nov. 13, 2020

(86) PCT No.: PCT/GB2020/052895
§ 371 (c)(1),
(2) Date: May 6, 2022

(87) PCT Pub. No.: WO2021/094771
PCT Pub. Date: May 20, 2021

(65) Prior Publication Data
US 2022/0411913 A1    Dec. 29, 2022

(30) Foreign Application Priority Data
Nov. 15, 2019 (GB) .................... 1916635

(51) Int. Cl.
C23C 14/08  (2006.01)
C23C 14/34  (2006.01)
(Continued)

(52) U.S. Cl.
CPC .......... *C23C 14/08* (2013.01); *C23C 14/3471* (2013.01); *C23C 14/562* (2013.01);
(Continued)

(58) Field of Classification Search
CPC ..................................................... H01M 4/04
See application file for complete search history.

(56) References Cited

U.S. PATENT DOCUMENTS

| | | | |
|---|---|---|---|
| 3,829,373 | A | 8/1974 | Kuehnle |
| 4,026,787 | A | 5/1977 | Kuehnle |

(Continued)

FOREIGN PATENT DOCUMENTS

| | | | |
|---|---|---|---|
| CN | 101457343 A | | 6/2009 |
| CN | 101527362 A | | 9/2009 |

(Continued)

OTHER PUBLICATIONS

Office Action received for Japanese Patent Application No. 2022-528153, mailed on Jul. 25, 2023, 7 pages (3 pages of English Translation and 4 pages of Original Document).

(Continued)

*Primary Examiner* — Austin Murata
(74) *Attorney, Agent, or Firm* — Tucker Ellis LLP

(57) ABSTRACT

A method of manufacturing a battery cathode for a solid state battery is provided. The method includes generating a plasma remote from one or more targets suitable for forming cathodes, such as $LiCoO_2$, exposing the plasma target or targets to the plasma, thereby generating sputtered material from the target or targets, and depositing sputtered material on a first portion of a substrate, thereby forming crystalline material, such as $LiCoO_2$ on the first portion of the substrate.

22 Claims, 26 Drawing Sheets

(51) Int. Cl.
  *C23C 14/56* (2006.01)
  *H01M 4/04* (2006.01)
  *H01M 4/131* (2010.01)
  *H01M 4/505* (2010.01)
  *H01M 4/525* (2010.01)
  *H01M 4/02* (2006.01)

(52) U.S. Cl.
  CPC ......... *H01M 4/0426* (2013.01); *H01M 4/131* (2013.01); *H01M 4/505* (2013.01); *H01M 4/525* (2013.01); *H01M 2004/028* (2013.01)

(56) References Cited

U.S. PATENT DOCUMENTS

| | | |
|---|---|---|
| 4,278,528 A | 7/1981 | Kuehnle et al. |
| 4,492,620 A | 1/1985 | Matsuo et al. |
| 4,849,087 A | 7/1989 | Meyer |
| 4,990,229 A | 2/1991 | Campbell et al. |
| 5,091,049 A | 2/1992 | Campbell et al. |
| 5,122,251 A | 6/1992 | Campbell et al. |
| 5,215,638 A | 6/1993 | Hausler |
| 6,103,070 A | 8/2000 | Hong |
| 6,632,563 B1 | 10/2003 | Krasnov et al. |
| 2001/0033952 A1 | 10/2001 | Jenson et al. |
| 2002/0144656 A1 | 10/2002 | Yoshikawa et al. |
| 2002/0175069 A1* | 11/2002 | Domoto .............. C23C 14/3464 |
| | | 204/298.18 |
| 2004/0048157 A1* | 3/2004 | Neudecker .......... H01M 4/5825 |
| | | 427/126.3 |
| 2004/0118678 A1 | 6/2004 | Hartig |
| 2006/0134522 A1 | 6/2006 | Zhang et al. |
| 2006/0196766 A1 | 9/2006 | Chen |
| 2007/0125638 A1 | 6/2007 | Zhang et al. |
| 2007/0166612 A1* | 7/2007 | Krasnov ................. H01M 6/40 |
| | | 29/623.5 |
| 2007/0181421 A1 | 8/2007 | Wei et al. |
| 2008/0023146 A1 | 1/2008 | Shabalin |
| 2008/0035471 A1 | 2/2008 | Mikami et al. |
| 2008/0213664 A1* | 9/2008 | Krasnov ................. H01M 4/139 |
| | | 429/220 |
| 2009/0032191 A1 | 2/2009 | Chistyakov |
| 2009/0057136 A1 | 3/2009 | Wang et al. |
| 2009/0159429 A1 | 6/2009 | Tsukamoto |
| 2009/0159433 A1 | 6/2009 | Neudecker et al. |
| 2009/0159441 A1 | 6/2009 | Marunaka et al. |
| 2009/0277778 A1 | 11/2009 | Stowell et al. |
| 2009/0288943 A1* | 11/2009 | Kwak ................. H01M 4/5825 |
| | | 204/192.12 |
| 2011/0117433 A1 | 5/2011 | Sabi et al. |
| 2011/0226617 A1 | 9/2011 | Hofmann et al. |
| 2011/0266141 A1 | 11/2011 | Drayton et al. |
| 2012/0275008 A1 | 11/2012 | Pradhan et al. |
| 2013/0112546 A1 | 5/2013 | Brown et al. |
| 2014/0183036 A1 | 7/2014 | Shao et al. |
| 2014/0272190 A1* | 9/2014 | Huang ................. H01M 4/0471 |
| | | 427/559 |
| 2015/0016265 A1 | 1/2015 | Ahmadi |
| 2016/0233541 A1 | 8/2016 | Anapolsky et al. |
| 2017/0207071 A1 | 7/2017 | De Bosscher et al. |
| 2018/0245217 A1 | 8/2018 | Guo |
| 2019/0153589 A1 | 5/2019 | Puls et al. |
| 2020/0095672 A1* | 3/2020 | Honma ................. C23C 14/352 |
| 2021/0359286 A1* | 11/2021 | Matsuki .............. H01M 50/103 |
| 2021/0371297 A1 | 12/2021 | Perkins et al. |
| 2022/0277940 A1 | 9/2022 | Rendall |
| 2022/0380885 A1 | 12/2022 | Rendall et al. |
| 2022/0380903 A1 | 12/2022 | Rendall et al. |
| 2022/0384159 A1 | 12/2022 | Rendall et al. |
| 2022/0389586 A1 | 12/2022 | Rendall et al. |
| 2022/0393142 A1 | 12/2022 | Gruar |
| 2022/0396865 A1 | 12/2022 | Rendall et al. |
| 2022/0396869 A1 | 12/2022 | Rendall |
| 2022/0403499 A1 | 12/2022 | Rendall et al. |
| 2022/0407043 A1 | 12/2022 | Rendall et al. |
| 2023/0220539 A1 | 7/2023 | Rendall et al. |

FOREIGN PATENT DOCUMENTS

| | | |
|---|---|---|
| CN | 101903560 A | 12/2010 |
| CN | 101970709 A | 2/2011 |
| CN | 102037586 A | 4/2011 |
| CN | 105593395 A | 5/2016 |
| CN | 105874641 A | 8/2016 |
| CN | 105951053 A | 9/2016 |
| CN | 205803586 U | 12/2016 |
| CN | 106684325 A | 5/2017 |
| CN | 108281618 A | 7/2018 |
| CN | 109075006 A | 12/2018 |
| CN | 109402562 A | 3/2019 |
| CN | 109415802 A | 3/2019 |
| CN | 109415804 A | 3/2019 |
| CN | 109477203 A | 3/2019 |
| CN | 109844900 A | 6/2019 |
| CN | 110168130 A | 8/2019 |
| DE | 4126236 A1 | 2/1993 |
| DE | 4418906 A1 | 12/1995 |
| EP | 0103461 A2 | 3/1984 |
| EP | 0403418 A2 | 12/1990 |
| EP | 0837490 A2 | 4/1998 |
| EP | 1729330 A1 | 12/2006 |
| EP | 2527487 A1 | 11/2012 |
| EP | 3396751 A1 | 10/2018 |
| EP | 3399539 A1 | 11/2018 |
| GB | 1462241 A | 1/1977 |
| GB | 0007173 | 5/2000 |
| GB | 2360530 A | 9/2001 |
| GB | 2572610 A | 10/2019 |
| JP | 49-101273 A | 9/1974 |
| JP | 61-009575 A | 1/1986 |
| JP | 61-093542 A | 5/1986 |
| JP | 03-068773 A | 3/1991 |
| JP | H05-171433 A | 7/1993 |
| JP | 10-150210 A | 6/1998 |
| JP | H10-510676 A | 10/1998 |
| JP | 11-269643 A | 10/1999 |
| JP | 2002-235171 A | 8/2002 |
| JP | 2003-007291 A | 1/2003 |
| JP | 2004-043934 A | 2/2004 |
| JP | 2006-257546 A | 9/2006 |
| JP | 2006322055 A | 11/2006 |
| JP | 2007-005219 A | 1/2007 |
| JP | 2007-067183 A | 3/2007 |
| JP | 2008-045213 A | 2/2008 |
| JP | 2008-138229 A | 6/2008 |
| JP | 2011-032550 A | 2/2011 |
| JP | 2011-108532 A | 6/2011 |
| JP | 2011-521433 A | 7/2011 |
| JP | 2011-225932 A | 11/2011 |
| JP | 2013-028824 A | 2/2013 |
| JP | 2013-164971 A | 8/2013 |
| JP | 2015193863 A | 11/2015 |
| JP | 2015232158 A | 12/2015 |
| JP | 2017-186581 A | 10/2017 |
| JP | 6215329 B2 | 10/2017 |
| JP | 2019-104956 A | 6/2019 |
| KR | 10-2006-0124978 A | 12/2006 |
| KR | 100762698 B1 | 10/2007 |
| KR | 10-2008-0000736 A | 1/2008 |
| KR | 10-2011-0092965 A | 8/2011 |
| KR | 10-2015-0005262 A | 1/2015 |
| KR | 101990881 B1 | 6/2019 |
| KR | 20190065233 A | 6/2019 |
| WO | 89/07664 A1 | 8/1989 |
| WO | 02/21627 A2 | 3/2002 |
| WO | 2004/017356 A2 | 2/2004 |
| WO | 2009/143254 A2 | 11/2009 |
| WO | 2010/023878 A1 | 3/2010 |
| WO | 2010/144761 A2 | 12/2010 |
| WO | 2011/131921 A1 | 10/2011 |
| WO | 2014/156129 A1 | 10/2014 |
| WO | 2016/078693 A1 | 5/2016 |
| WO | 2018/001523 A1 | 1/2018 |
| WO | 2018/128009 A1 | 7/2018 |
| WO | 2018/202656 A1 | 11/2018 |
| WO | 2018/225822 A1 | 12/2018 |

(56) References Cited

FOREIGN PATENT DOCUMENTS

| WO | 2019/181095 A1 | 9/2019 |
|---|---|---|
| WO | 2021/094721 A1 | 5/2021 |
| WO | 2021/094772 A1 | 5/2021 |

OTHER PUBLICATIONS

Office Action received for Japanese Patent Application No. 2022-528191, mailed on Jun. 27, 2023, 14 pages (8 pages of English Translation and 6 pages of Original Document).

Office Action received for Japanese Patent Application No. 2022-528195, mailed on Jun. 27, 2023, 11 pages (6 pages of English Translation and 5 pages of Original Document).

Office Action received for Japanese Patent Application No. 2022-528167, mailed on Aug. 29, 2023, 2 pages of Original Document Only.

Kikuchi et al., "Modification of Film Structure in Sputtering Process," Journal of the Vacuum Society of Japan, vol. 50, No. 1, 2007, pp. 14-21.

Office Action received for Japanese Patent Application No. 2022-528173, mailed on Aug. 1, 2023, 4 pages (2 pages of English Translation and 2 pages of Original Document).

Office Action received for Japanese Patent Application No. 2022-528178, mailed on Aug. 8, 2023, 6 pages (3 pages of English Translation and 3 pages of Original Document).

Office Action received for Japanese Patent Application No. 2022-528188, mailed on Aug. 8, 2023, 6 pages (3 pages of English Translation and 3 pages of Original Document).

Office Action received for Japanese Patent Application No. 2022-528189, mailed on Aug. 8, 2023, 6 pages (3 pages of English Translation and 3 pages of Original Document).

Akazawa, "Highly adhesive Pt-electrode films directly deposited on SiO2 by electron-cyclotron-resonance plasma sputtering", Surface & Coatings Technology, vol. 204, 2010, pp. 1836-1841.

Combined Search and Examination Report Received for GB Application No. 1916628.9, mailed on May 5, 2020, 6 pages.

Combined Search and Examination Report Received for GB Application No. 1916632.1, mailed on May 5, 2020, 3 pages.

Combined Search and Examination Report Received for GB Application No. 1916633.9, mailed on May 4, 2020, 3 pages.

Combined Search and Examination Report Received for GB Application No. 1916634.7, mailed on May 15, 2020, 3 pages.

Combined Search and Examination Report Received for GB Application No. 1916635.4, mailed on May 5, 2020, 4 pages.

GB Search Report received for Application No. 1916619.8, mailed on May 7, 2020, 1 page.

GB Search Report received for Application No. 1916622.2, mailed on Mar. 30, 2020, 1 page.

GB Search Report received for Application No. 1916624.8, mailed on Apr. 29, 2020, 1 Page.

GB Search Report Received for GB Application No. 1916626.3, mailed on May 12, 2020, 1 page.

GB Search Report Received for GB Application No. 1916629.7, mailed on May 15, 2020, 1 page.

GB Search Report received for Patent Application No. 1916627.1, mailed on May 12, 2020, 1 page.

GB Search Report received for Patent Application No. 1916637.0, mailed on Mar. 30, 2020, 1 Page.

Hayashi et al., "Preparation of positive LiCoO2 films by electron cyclotron resonance (ECR) plasma sputtering method and its application to all-solid-state thin-film lithium batteries" Journal of Power Sources, vol. 174, 2007, pp. 990-995.

International Search Report and Written Opinion received for PCT Patent Application No. PCT/GB20/052837, mailed on Feb. 12, 2021, 11 pages.

International Search Report and Written Opinion received for PCT Patent Application No. PCT/GB2020/052839, mailed on Feb. 23, 2021, 11 pages.

International Search Report and Written Opinion received for PCT Patent Application No. PCT/GB2020/052840, mailed on Feb. 25, 2021, 11 pages.

International Search Report and Written Opinion received for PCT Patent Application No. PCT/GB2020/052841, mailed on Mar. 1, 2021, 13 pages.

International Search Report and Written Opinion received for PCT Patent Application No. PCT/GB2020/052842, mailed on Feb. 25, 2021, 11 pages.

International Search Report and Written Opinion received for PCT Patent Application No. PCT/GB2020/052843, mailed on Feb. 26, 2021, 13 pages.

International Search Report and Written Opinion received for PCT Patent Application No. PCT/GB2020/052844, mailed on Feb. 18, 2021, 12 pages.

International Search Report and Written Opinion received for PCT Patent Application No. PCT/GB2020/052848, mailed on Dec. 23, 2020, 10 pages.

International Search Report and Written Opinion received for PCT Patent Application No. PCT/GB2020/052892, mailed on Feb. 25, 2021, 12 pages.

International Search Report and Written Opinion received for PCT Patent Application No. PCT/GB2020/052894, mailed on Mar. 9, 2021, 13 pages.

International Search Report and Written Opinion received for PCT Patent Application No. PCT/GB2020/052895, mailed on Mar. 5, 2021, 12 pages.

International Search Report and Written Opinion received for PCT Patent Application No. PCT/GB2020/052897, mailed on Mar. 3, 2021, 12 pages.

Julien E. et al., "Sputtered LiCoO2 Cathode Materials for All-solid-state Thin-film Lithium Microbatteries," Materials, vol. 12, No. 17, 2019, 2687, pp. 26.

Knox-Davies et al., "Properties of nanocrystalline GaN films deposited by reactive sputtering," Diamond and Related Materials, Elsevier Science Publishers, vol. 12, No. 8, 2003, pp. 1417-1421.

Office Action received for Japanese Patent Application No. 2022-528195, mailed on Oct. 17, 2023, 10 pages (6 pages of English Translation and 4 pages of Original Document).

International Search Report and Written Opinion received for PCT Patent Application No. PCT/GB2020/052838, mailed on Feb. 18, 2021, 9 pages.

International Search Report and Written Opinion received for PCT Patent Application No. PCT/GB2020/052893, mailed on Feb. 22, 2021, 11 pages.

International Search Report and Written Opinion received for PCT Patent Application No. PCT/GB2020/052896, mailed on Feb. 22, 2021, 10 pages.

Ribeiro, J. F., et al. "Lithium cobalt oxide crystallization on flexible polyimide substrate." Journal of Materials Science: Materials in Electronics 27 (2016): 631-636.

\* cited by examiner

METHOD OF MANUFACTURING SOLID STATE BATTERY CATHODES FOR USE IN BATTERIES

CROSS-REFERENCE TO PRIOR APPLICATION

This application is a § 371 National Stage Application of PCT International Application No. PCT/GB2020/052895 filed Nov. 13, 2020, which claims the priority of United Kingdom Application No. 1916635.4, filed Nov. 15, 2019, each of which are herein incorporated by reference in their entirety.

BACKGROUND OF THE INVENTION

The present disclosure relates a method of depositing thin films, using a remotely generated plasma.

The present disclosure relates to methods of depositing thin films onto substrates. More particularly, but not exclusively, the present invention relates to a method of sputtering material from a target such that it is deposited as a thin film on a substrate, wherein the material is sputtered from the target by a remotely generated plasma, and upon deposition on to the substrate, the material directly forms a thin film with a crystalline structure.

Plasma deposition systems are widely used in a range of industries, from electronic device manufacture to the production of hardwearing coatings. In the electronic device sector, there are a number of established plasma deposition technologies. These include DC sputtering, RF sputtering, pulsed DC sputtering, magnetron sputtering (DC, RF or pulsed DC), reactive sputtering, and plasma-enhanced chemical vapour deposition.

PCT publication WO2011/131921A1 discloses a method of using a remotely generated plasma, and guiding said plasma onto the target in such a way that there is uniform sputtering of the target material.

However, WO2011/131921A1 is not concerned with the deposition of crystalline thin-films at all, and certainly not the deposition of thin-films in situ. It does not discuss, or anticipate, a method of how to deposit a crystalline film in situ through manipulation of certain parameters of a thin film deposition system that utilises a remotely generated plasma. Additionally, WO2011/131921A1 does not discuss a plasma/target geometric arrangement that allows for achieving the preservation of stoichiometry between a target material and a thin film formed through sputter deposition of said target.

CN105821378 discloses a method of forming crystalline film of antimony doped tin oxide on a substrate using a remotely generated plasma. Whilst this document discloses this process occurring at relatively low temperatures, it should be noted that this is enabled by the relatively low energy crystal structure of antimony doped tin oxide, and is therefore not relevant when discussing the formation of the high-energy crystal structure required by $LiCoO_2$.

Whilst the techniques that comprise the state of the art are capable of producing thin films of high quality material, there remains a long felt need for an ability to produce crystalline films of highly ordered material, such as layered oxide materials, at temperatures sufficiently low to allow the use of a wide range of substrate materials and thicknesses.

SUMMARY OF INVENTION

In accordance with the first aspect of the invention there is provided a method of manufacturing a layer of cathode, optionally for a solid state battery, the method comprising:

providing a substrate;
generating a plasma remote from one or more targets suitable for forming a cathode;
confining the plasma in a space between the substrate and the one or more cathode material sputter targets;
exposing the plasma target or targets to the plasma, thereby generating sputtered material from the target or targets
depositing sputtered material on the substrate, thereby forming a layer of cathode on the substrate.

The applicant has discovered that it is possible to form films of cathode material directly onto substrates. In "directly", what is meant is that the film forms a film with substantially no annealing step. The method has been shown to work on a wide range of substrate materials. The applicant has discovered that the method is particularly effective for depositing crystalline alkali and alkaline earth metal-based cathode materials, such as lithium-based cathode layers. The applicant has discovered that it is possible to deposit a layer of cathode by generating a plasma remote from one or more suitable targets, use the plasma to generate sputtered material from the target(s), and deposit sputtered material into the substrate to form a layer of cathode.

The sputter target and substrate together define a deposition space in which the plasma can be generated and confined such that maximum efficiencies in generation and utilisation of the plasma can be achieved. In examples, the plasma is generated and confined in said deposition space (i.e. between the sputter target and substrate) to enhance and achieve industrial-scale deposition and full target utilisation.

The layer of cathode may be suitable for a battery cathode.

The layer of cathode may be ordered and may, for example, be crystalline.

The cathode material of the layer of cathode may comprise one or more alkali metals, such as lithium. The cathode material may comprise oxygen, and may comprise an oxide or phosphate, for example. The cathode material may comprise one or more transition metals, optionally more than one transition metal. The one or more transition metal may be in period 4 or period 5 of the Periodic Table. The one or more transition metal may be selected from the group consisting of Co, Ni, Mn, Fe, V, Nb and Ti, and may optionally be selected from the group consisting of CO, Ni and Mn. The cathode material may comprise one or more alkali metal, one or more transition metal and (each of which is selected from the group consisting of Co, Ni, Mn, Fe, V, Nb and Ti, and optionally from the group consisting of Co, Ni and Mn), and optionally another metal not being an alkali metal or a transition metal (such as aluminium). The cathode material may be an oxide or phosphate, and may comprise lithium and at least one transition metal, and optionally more than one transition metal, each transition metal being selected from the group consisting of Co, Ni, Mn, Fe, V, Nb and Ti, and optionally from the group consisting of Co, Ni and Mn. The cathode material may be an oxide or phosphate, and may consist of oxygen (in the case of an oxide) or phosphate (in the case of a phosphate), in combination with lithium and at least one transition metal, and optionally more than one transition metal, each transition metal being selected from the group consisting of Co, Ni, Mn, Fe, V, Nb and Ti, and optionally from the group consisting of Co, Ni and Mn, and optionally aluminium.

The cathode material optionally comprises lithium and one or more of manganese, nickel and cobalt, and optionally aluminium.

The cathode material is optionally an oxide, said oxide comprising lithium and one or more of manganese, nickel and cobalt, and optionally aluminium.

The cathode material is optionally on oxide, said oxide consisting essentially of oxygen, lithium, one or more of manganese, nickel and cobalt, and optionally aluminium.

The cathode material may be of empirical formula $A_aM1_bM2_cO_2$, wherein A is an alkali metal (optionally lithium), M1 is one or more transition metal (optionally one or more of cobalt, nickel, niobium, vanadium and manganese) (b being the total of transition metal), M2 being aluminium, a being from 0.5 to 1.5 and z being from 0 to 0.5.

Optionally, a is 1, b is 1 and c is 0. Optionally, M1 is one of cobalt, nickel, vanadium, niobium and manganese.

Optionally, a is more than 1 and A is lithium. In the case, the materials are sometimes known as "lithium rich" materials. Such lithium-rich materials may be

$$Li_{\left(\frac{4}{3}-\frac{2x}{3}\right)}Ni_xMn_{\left(\frac{2}{3}-\frac{x}{3}\right)}O_2$$

with x=0, 0.06, 0.12, 0.2, 0.3 and 0.4, for example.

Another such material is

$$Li_{\left(\frac{4}{3}-\frac{y}{s}\right)}Co_yMn_{\left(\frac{2}{3}-\frac{sy}{s}\right)}O_2$$

wherein y has a value greater than 0.12 and equal to or less than 0.4.

Another such material is

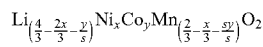

$$Li_{\left(\frac{4}{3}-\frac{2x}{3}-\frac{y}{s}\right)}Ni_xCo_yMn_{\left(\frac{2}{3}-\frac{x}{3}-\frac{sy}{s}\right)}O_2$$

wherein x has a value equal to or greater than 0.175 and equal to or less than 0.325; and y has a value equal to or greater than 0.05 and equal to or less than 0.35.

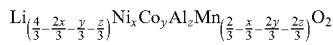

$$Li_{\left(\frac{4}{3}-\frac{2x}{3}-\frac{y}{3}-\frac{z}{3}\right)}Ni_xCo_yAl_zMn_{\left(\frac{2}{3}-\frac{x}{3}-\frac{2y}{3}-\frac{2z}{3}\right)}O_2$$

is another such material, wherein x is equal to or greater than 0 and equal to or less than 0.4; y is equal to or greater than 0.1 and equal to or less than 0.4; and z is equal to or greater than 0.02 and equal to or less than 0.3.

The substrate may comprise polymer. The substrate may be flexible. The substrate may comprise polyethylene terephthalate (PET), or polyethylene naphthalate (PEN). PEN and PET are reasonably flexible, and relatively high tensile strength due to their semi-crystalline structure.

The method may comprise depositing cathode material on a first portion of the substrate. The method may comprise moving the substrate, and depositing sputtered material on a second portion of substrate, thereby forming cathode material on the second portion of the substrate.

This facilitates the reasonably rapid production of relatively large areas of cathode.

The substrate may comprise, or be in the form of, a sheet or web, optionally an elongate sheet or web. Such a sheet or web may be provided in the form of a roll or stack. Preferably, the substrate is provided as a roll. This facilitates simple and safe storage and handling of the substrate.

The substrate may be movably mounted to facilitate movement of the substrate (optionally in the form of a sheet). The substrate may be mounted in a roll-to-roll arrangement. Substrate upstream of the plasma deposition process may be held on roller or drum. Substrate downstream of the plasma deposition process may be held on a roller or drum. This facilitates simple and rapid handling of flexible sheets of substrate. A shutter may be provided to allow for a portion of the substrate to be exposed to the remotely generated plasma.

The use of a roll-to-roll arrangement has a number of advantages. It facilitates a high material throughput and allows a large cathode area to be deposited on one large substrate, though a series of depositions at a first portion of the substrate, followed by a second portion of the substrate, and so on. One of the main benefits of a roll-to-roll processing is that it allows for a number of depositions to occur without breaking vacuum. This saves both time and energy compared to systems in which the chamber needs to be taken to back up to atmospheric pressure from vacuum after deposition, in order to load a new substrate.

The plasma deposition process optionally takes place in a chamber. The upstream drum or roller for carrying the substrate may be located inside or outside the chamber. The downstream drum or roller for carrying the substrate may be located inside or outside the chamber.

The substrate may optionally not exceed its temperature corrected yield strength at any point as it passes between the upstream and downstream rollers or drums. This is important as roll-to-roll processing machines require the substrate to be in tension as the substrate is fed through various rolls, rollers and drums. If the substrate comprises a polymer, then as the polymer heats up, its yield strength may begin to lower. If the polymer increases in temperature too much, the polymer may begin to deform as it passes through the roll-to-roll machine. This can lead to buckles, jams, and uneven deposition onto the substrate. Preferably, the temperature of the substrate does not exceed 200 degrees at any point during the plasma deposition process, or as it passes between the upstream and downstream rollers or drums.

One or more target(s) may optionally comprise the cathode material that forms the layer of cathode. Using a target of the cathode material helps preserve stoichiometry during the deposition process. This ceramic target is also more resilient to ultra-high vacuum ($10^{-9}$ mbar or lower) than elemental lithium, and will not sublime at these pressures. Being able to run the system at a stronger vacuum is advantageous as it allows for a higher deposition rate.

One or more target(s) may optionally comprise a distinct region of elemental first metal (such as lithium), and a distinct region of elemental second metal (such as cobalt).

A "distinct region" can mean either its own target, or an area of a target. A single target which comprises multiple distinct regions of different first metal and/or second metal species can be referred to as a composite target.

One or more target(s) optionally comprise a distinct region of first elemental metal (such as lithium), a distinct region of second elemental metal (such as cobalt), a distinct region of an oxide of the first metal (such as lithium oxide), a distinct region of an oxide of the second metal (such as cobalt oxide), a distinct region of first and second elemental metals (such as LiCo), a distinct region of the cathode material (such as $LiCoO_2$), or any combination thereof.

Oxide targets or mixed elemental targets (e.g. lithium oxide, cobalt oxide, LiCo and $LiCoO_2$) are useful targets to use as they are far less expensive than their elemental metal counterparts. They are also more environmentally stable, and are easier to handle in an industrial environment.

The method may also optionally comprise the sputtering of material under a reactive sputtering regime, using a reactive gas, such as oxygen, nitrogen, ozone or ammonia.

In a reactive sputtering method, a reactive gas is provided, along with the inert sputter gas. This allows elemental targets to be used, and oxides to form as part of the plasma sputtering process. Generally, the structure and form of the oxide produced may be adjusted, by providing the reactive oxygen gas at a higher or lower flow rate.

The thickness of the deposited cathode material on completion of the method is optionally no more than 10 microns.

The thickness of the substrate is optionally no more than 1.6 microns. The thickness of the substrate provided is optionally less than 1.0 microns.

It is beneficial when designing solid state batteries for the substrate to be as thin as possible. This allows for batteries with a higher energy density to be manufactured. Preferably, if a thinner substrate became available, which met the necessary requirements of a relatively high temperature corrected yield strength and high degradation point, this substrate would be used for the method.

At least a portion of and optionally all of the deposited material may have a hexagonal crystal structure. If the cathode material comprises $LiCoO_2$, for example, the crystal structure of the $LiCoO_2$ which is deposited is optionally in the R3 (bar) m space group.

The $R\bar{3}m$ space group structure is a layered oxide structure. This structure has a number of benefits, such as having a high usable capacity and high speed of charging and discharging compared to the low energy structure of $LiCoO_2$, which has a structure in the Fd3m space group. The $R\bar{3}m$ space group is regarded as having better performance in typical battery applications due to enhanced reversibility and fewer structural changes on lithium intercalation and deintercalation. Therefore crystalline $LiCoO_2$ in the $R\bar{3}m$ space group is favoured for solid state battery applications.

During the deposition part of the method, the crystals may optionally grow substantially epitaxially from the surface of the substrate.

Epitaxial growth is favoured as it allows for lithium ions to intercalate and deintercalate more easily.

The crystals are optionally aligned with the (101) and (110) planes substantially parallel to the substrate. At least a portion of and optionally all of the deposited material may have a hexagonal crystal structure.

The target optionally has a power density associated with the bias applied to it of at least $1.0$ $Wcm^{-2}$. Such a power density has been found to be effective in order for the sputtering threshold to be passed, the target material to sputter.

The power density associated with the bias applied to the target is optionally up to $100$ $Wcm^{-2}$.

The temperature experienced by the first portion or second portion of the substrate during the manufacturing process optionally does not exceed the degradation temperature of the substrate material.

The ratio of the power supplied to generate the remote plasma to the power associated with the bias of the target is optionally more than 1:1.

The inventors have found that surprisingly, above this ratio, that thin films of cathode material, such as $LiCoO_2$, form crystalline structure directly in situ on the film. In the system where this was found by the inventors, the efficiency of the power source used to generate the remote plasma was taken to be 50%. In this connection, the efficiency of the generation of the plasma ([actual power in the plasma/power used to generate the plasma]×100). The efficiency of the generation of the plasma may be anywhere between 50% and 85%. It may be the case that this ratio is adjusted, such that it is "normalised" with respect to efficiency. For example, in the case where the efficiency of the generation of the plasma is actually 85%, the normalised efficiency of the plasma would be [(1×0.5)/0.85=approx. 0.6] approximately 0.6:1.

The ratio of the power supplied to generate the remote plasma to the power associated with the bias of the target is optionally no more than 7:2. This is under the assumption that the efficiency of the generation of the plasma is taken to be 50%, and this ratio may or may not be normalised as previously described, if the efficiency of the generation of the plasma is greater or lower than 50%. The means of powering the plasma source may be of RF, DC, or pulsed-DC type.

The ratio of the power supplied to generate the remote plasma to the power associated with the bias of the target is optionally no more than 3:2. This is under the assumption that the efficiency of the generation of the plasma is taken to be 50%, and this ratio may or may not be normalised as previously described, if the efficiency of the generation of the plasma is greater or lower than 50%.

Optionally, the maximum temperature reached at any given time by any given square of substrate material having an area of $1$ $cm^2$ as measured on the surface opposite to said surface on which the material is deposited and as averaged over a period of 1 second, is less than 500° C., optionally no more than 300° C., optionally no more than 200 degrees C., optionally no more than 190 degrees C., optionally no more than 180 degrees C., optionally no more than 170 degrees C., optionally no more than 160 degrees C. and optionally no more than 150 degrees C.

If there are one or more targets comprising regions of second elemental metal (such as cobalt) or oxide thereof, and one or more targets comprising regions of first elemental metal (such as lithium) or oxide thereof, then optionally the targets comprising regions of second elemental metal or oxide thereof are angled such that their angle of incidence in relation to the plane defined by the surface of the remotely generated plasma is greater than that of targets comprising regions of first elemental metal or oxide thereof. Optionally, the targets comprising regions of second elemental metal or oxide thereof and the targets comprising regions of first elemental metal or oxide thereof are arranged such that ions of the first and second metals are sputtered at substantially the same rate. This is beneficial, as it helps targets made of different materials to be depleted at the same rate, allowing the targets to be replaced at the same time. This may result in less waste from only partially utilised targets.

Optionally, the geometry of the surface defined by the remotely generated plasma is curved, at a location substantially near to the one or more targets. This optionally allows for tuning the sputter rate of individual targets in an angled target assembly. A curved plasma facilitates some control over the amount of interaction between the target and plasma, depending on the angle of orientation of the target. This is possible because curving the plasma allows for targets at a non-zero angle (i.e. titled angle) in relation to the plane defined by the plasma if the plasma profile was flat, to be exposed to a higher density of plasma, and therefore to sputter at a higher rate. This can be tuned, such that curving the plasma more or less resulting in submerging the target in a lower or higher density of plasma.

Plumes of material may optionally be sputtered from targets. These plumes may optionally overlap. For example, a first plume sputtered from a first target may overlap with a second plume sputtered from a second target. The first target may comprise lithium for example and the second target may comprise cobalt. The plumes may overlap such that the first portion of the substrate is coated with both the first and second plumes of material.

The substrate optionally comprises a current collecting layer. The current collecting layer may comprise an electrically-conductive material, such as an inert metal. The current collecting layer may be platinum. The current collecting layer may have a modified structure to increase its surface area. The current collecting layer may also act as an anode. The cathode material (such as $LiCoO_2$) may be deposited onto the current collecting layer. The substrate may be provided with an adhesion promoter layer immediately beneath the current collecting layer.

The working distance between the target and the substrate may be within +/−50% of the theoretical mean free path of the system.

Without wishing to be bound by theory, it is believed that the working distance has an influence on the "ad atom" energy of the sputtered material as it deposits onto the substrate. In a case where the working distance is greater than the mean free path of the system, it is thought that it is more likely that an ion in the sputter flux would be involved in a collision before reaching the substrate, resulting in relatively low ad atom energy. Conversely, if the working distance is shorter than the mean free path of the system, the ad atom energy is relatively high.

A definition of the mean free path is the average distance between collisions for an ion in the plasma. The mean free path is calculated based on the volume of interaction (varied by the working distance), and the number of molecules per unit volume (varied by the working pressure).

The working distance is optionally at least 3.0 cm, optionally at least 4.0 cm and optionally 5.0 cm. The working distance is optionally no more than 20 cm, optionally no more than 15 cm and optionally no more than 13 cm. The working distance may be from 4.0 cm to 13 cm, optionally from 6.0 cm to 10 cm, and optionally from 8.0 cm to 9.0 cm.

The working pressure may be from 0.00065 to 0.01 mBar, and optionally from 0.0010 mBar to 0.0065 mBar. A higher working pressure in this range may result in a higher deposition rate. This is because a higher working pressure results in a larger number of process ion (usually Ar+) bombardments on the surface of the target, and hence material is sputtered from the target at a higher rate.

When the working distance is from 8.0 to 9.0 cm, the range of crystallite sizes available may be narrower, for example, if a working pressure of from 0.0010 mBar to 0.0065 mBar is used. The crystallite size may be from 14 to 25 nm. This is evidence that within these parameter ranges, it is possible to form films with narrow and predictable thin film ranges.

The surface onto which the layer of cathode is deposited may have a surface roughness Xs or less, where Xs=100 nm, and the cathode layer may have a thickness of from 0.01 to 10 μm and a surface roughness of no more than $X_1$, where $X_1$ equals the product of F and Xs, where F is a factor in the range of 1 to 2.

Xs may be no more than 10% of the thickness of the substrate. The product of the thickness of the substrate and Xs may be no more than $10^5$ $nm^2$.

The substrate, optionally a polymer substrate, may be provided with embedded particles and of all of the embedded particles within or on the polymer material, the majority of those that contribute to surface roughness of the substrate have a median size from 10% to 125% of Xs.

Alternatively, the substrate, optionally a polymer substrate, may be provided with embedded particles and of all of the embedded particles within or on the polymer material, the majority of those that contribute to surface roughness of the substrate have a median size of no less than 150% of Xs.

The method may include a step of depositing material onto the surface using sputter deposition to form a further layer having a thickness of from 0.01 to 10 μm and a surface roughness of no more than 150% of Xs, the material composition of the crystalline layer being different from the material composition of the further layer.

The method may comprise plasma sputtering material from a first target comprising an alkali metal or an alkaline earth metal onto a surface of or supported by a substrate, there being at least a first plume corresponding to trajectories of particles from the first target onto the surface, and plasma sputtering material from a second target comprising a transition metal (such as cobalt) onto the surface, there being at least a second plume corresponding to trajectories of particles from the second target onto the surface, and wherein the first target is positioned to be non-parallel with the second target, the first plume and the second plume converge at a region proximate to the surface of or supported by the substrate, and the crystalline layer is formed on the surface at said region.

More plasma energy may be received at the first target than at the second target.

The first target may face towards the substrate in a first direction, and the second target may face towards the substrate in a second direction, the first and second directions converging towards the substrate.

The notional line parallel to the first direction which extends from the centre of the surface of the first target may intersect, in the cross-section, the notional line parallel to the second direction which extends from the centre of the surface of the second target, at a location closer to the substrate than to either of the targets.

The location of the intersection may be closer to the substrate than half of the shortest distance from either of the targets to the substrate.

At least one of the substrate and the first and second targets may be moving as the crystalline layer is being formed on the surface.

The substrate may have a radius of curvature at the region at which the first plume and the second plume converge and the targets are arranged circumferentially around the centre of the radius of curvature.

According to a second aspect of the present invention there is provided a layer of cathode made by the method of the first aspect of the invention, optionally a battery cathode. The layer of cathode of the second aspect of the present invention may comprise those features described above in relation to the method of the first aspect of the present invention.

According to a third aspect of the present invention, there is provided a method of manufacturing a cathodic half-cell of a battery (such as a solid state thin film battery), the method comprising:

making a battery cathode using the method of the first aspect of the present invention; and forming electrolyte onto said battery cathode.

The electrolyte is optionally a ceramic material, such as LiPON (lithium phosphorous oxynitride). The method may comprise generating a plasma remote from one or more targets comprising target material (such as $Li_3PO_4$); exposing the plasma target or targets to the plasma, thereby generating sputtered material from the target or targets, optionally in a reactive atmosphere comprising a reactive gas (such as nitrogen), thereby forming ceramic material (such as LiPON) on the battery cathode.

Alternatively, the electrolyte comprises a polymer. In this case, the method may comprise depositing a polymer onto said battery cathode. Alternatively or additionally, the method may comprise depositing a precursor onto said battery cathode and forming a polymer from the precursor.

The method may comprise depositing a current collecting layer on the ceramic battery electrolyte material.

According to a fourth aspect of the present invention, there is provided a cathodic half cell made by the method of the third aspect of the present invention.

In accordance with a fifth aspect of the present invention, there is provided a method of making a solid state battery cell, the method comprising making a cathodic half cell in accordance with the method of the third aspect of the present invention and contacting said cathodic half cell with an anode or depositing anode-forming material on the electrolyte.

The anode-forming material may comprise an electrically-conductive material. The anode-forming material may comprise a lithium alloy or a metal, such as lithium or copper.

In accordance with a sixth aspect of the present invention, there is provided a solid state battery cell made in accordance with the method of the fifth aspect of the present invention.

In accordance with a seventh aspect of the present invention, there is provided a method of making a solid state battery comprising a plurality of solid state battery cells, the method comprising:

Making a plurality of solid state battery cells in accordance with the method of the fifth aspect of the present invention.

In accordance with an eighth aspect of the present invention, there is provided a solid state battery made in accordance with the method of the seventh aspect of the present invention.

It will of course be appreciated that features described in relation to one aspect of the present invention may be incorporated into other aspects of the present invention.

DESCRIPTION OF THE DRAWINGS

Embodiments of the present invention will now be described by way of example only with reference to the accompanying schematic drawings which can be briefly summarised as follows.

FIG. 3b is a schematic plan view of the plasma deposition chamber shown in FIG. 3a;

FIG. 9b is an X-ray diffraction spectra obtained from the film shown in FIG. 9a;

DETAILED DESCRIPTION

Figure 1A:
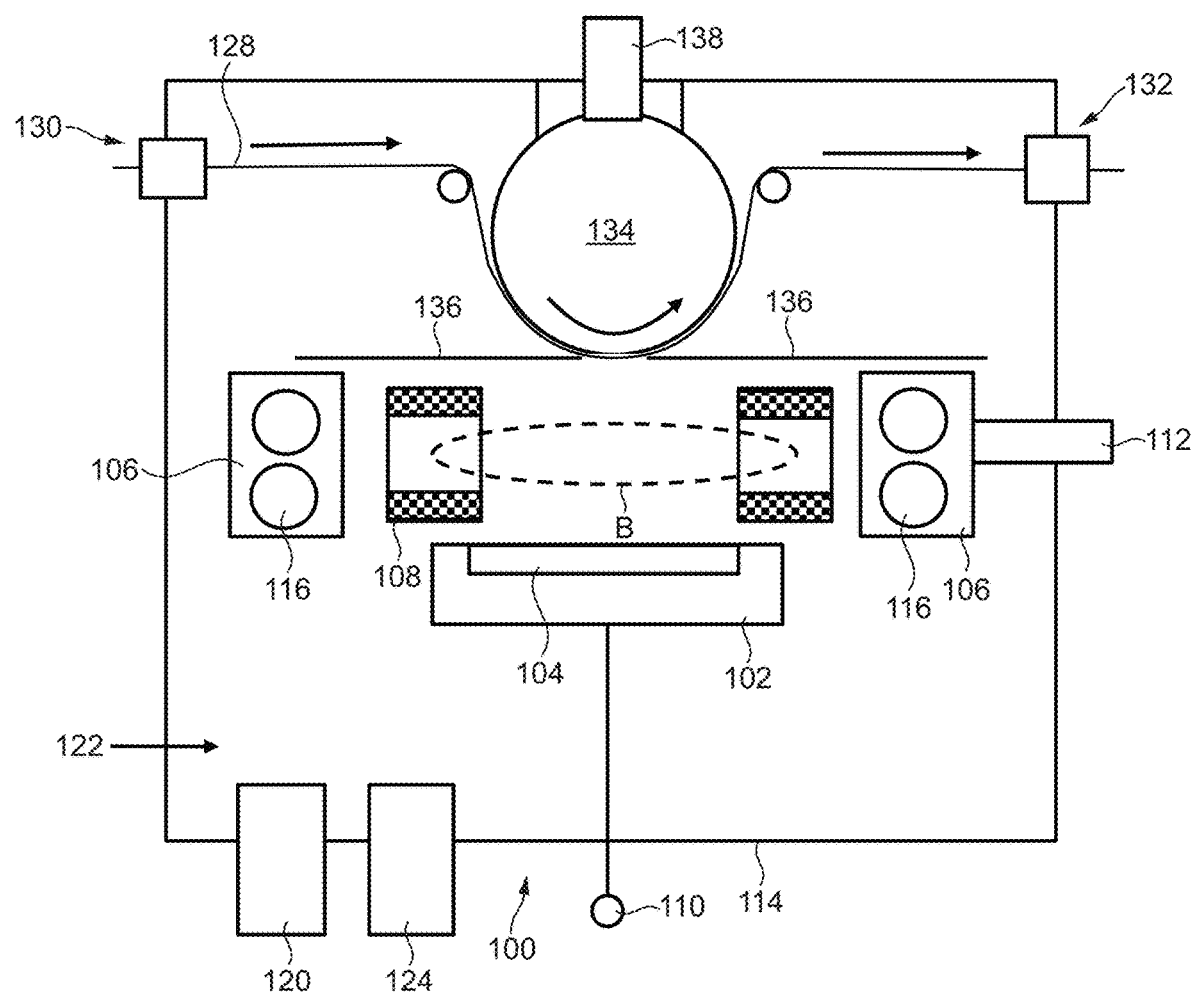
FIG. 1a is a schematic side-on view of a plasma deposition chamber used in accordance with a first example.
Figure 1B:
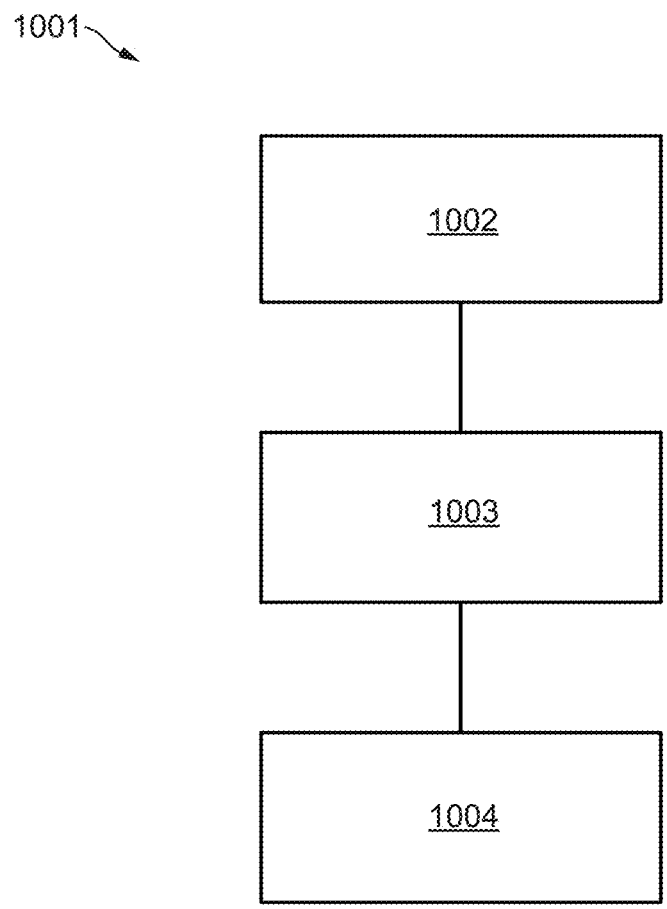
FIG. 1b shows the steps of a method of manufacturing a battery cathode in accordance with the first example.

FIG. 1a is a schematic side-on view of a plasma deposition process apparatus which is used in a method of depositing a (crystalline) material onto a substrate in accordance with a first example. The method is denoted generally by reference numeral 1001 and is shown schematically in FIG. 1b, and comprises generating 1002 a plasma remote from one or more targets, exposing 1003 the plasma target or targets to the plasma such that target material is sputtered from one or more targets, and exposing 1004 a first portion of a substrate to sputtered material such that the sputtered material is deposited onto the first portion of the substrate, thereby forming crystalline material onto the first portion of the substrate. The method of depositing a (crystalline) material onto the substrate may be performed as a part of a method of manufacturing a battery cathode.

The crystalline material in this example takes the form $ABO_2$. In the present example, the $ABO_2$ material takes a layered oxide structure. In the present example, the $ABO_2$ material is $LiCoO_2$. However, the method of the present example has been shown to work on a wide range of $ABO_2$ materials. In other examples, the $ABO_2$ material structure comprises at least one of the following compounds (described here with non-specific stoichiometry): LiCOO, LiCoAlO, LiNiCoAlO, LiMnO, LiNiMnO, LiNiMnCoO, LiNiO and LiNiCoO. These materials are potential candidates for manufacturing a battery cathode. Those skilled in the art will realise that the stoichiometry may be varied.

In this example, the $ABO_2$ material is $LiCoO_2$ and is deposited as a layer that is approximately 1 micron thick. In other examples, the $ABO_2$ material is deposited as layer that is approximately 5 microns thick. In yet further examples, the $ABO_2$ material is deposited as a layer that is approximately 10 microns thick.

With reference to FIG. 1a, the plasma deposition process apparatus is denoted generally by reference numeral 100 and comprises a plasma target assembly 102 comprising a target 104, a remote plasma generator 106, a series of electromagnets 108 for confining the plasma generated by the remote plasma generator 106, a target power supply 110, a remote plasma source power supply 112 and a housing 114. Remote plasma generator 106 comprises two pairs of radio frequency (RF) antennae 116. Housing 114 comprises a vacuum outlet 120 which is connected to a series of vacuum pumps located outside the chamber so that the chamber 122 defined by housing 114 can be evacuated. Housing 114 is also provided with a gas inlet 124 which may be connected to a gas supply (not shown) for the introduction of one or more gases into the chamber 122. In other examples, the gas inlet 124 may be positioned over the surface of the target assembly 102. As can be seen from FIG. 1a, the plasma is generated remote from the target 104.

In this example, the target 104 comprises material $LiCoO_2$. Briefly, the chamber 122 is evacuated until a sufficiently low pressure is reached. Power provided by power supply 112 is used to power the remote plasma generator 106 to generate a plasma. Power is applied to the target 104 such that plasma interacts with target 104, causing $LiCoO_2$ to be sputtered from the target 104 and onto the substrate 128. In the present example, the substrate 128 comprises a polymer sheet which is introduced into the housing 114 via inlet 130 and out of the housing 114 via outlet 132. A powered roller 134 is used to help move the substrate 128. The $LiCoO_2$ is deposited onto the substrate 128 as a crystalline (non-amorphous) material.

The apparatus 100 also comprises a shutter 136, for restricting deposition of sputtered material onto the substrate 128, and an input 138 for cooling the drum. Shutter 136 allows a portion of the substrate 128 to be exposed to the sputtered material.

As mentioned above, a powered roller 134 is used to help move the substrate 128 into and out of the plasma deposition apparatus 100. Powered roller 134 is part of a roll-to-roll substrate handling apparatus (not shown) which comprises at least a first storage roller upstream of the plasma deposition apparatus 100 and a second storage roller downstream of the plasma deposition apparatus 100. The roll-to-roll substrate handling apparatus is a convenient way of handling, storing and moving thin, flexible substrates such as the polymer substrate used in this example. Such a roll-to-roll system has a number of other advantages. It allows for a high material throughput and allows a large cathode area to be deposited on one substrate, throughout a series of depositions at a first portion of the substrate, followed by a second portion of the substrate, and so on. Furthermore, such roll-to-roll processing allows for a number of depositions to occur without breaking vacuum. This saves both time and energy compared to systems in which the chamber needs to be taken back up to atmospheric pressure from vacuum after deposition in order to load a new substrate. In other examples, sheet-to-sheet processing is used instead of roll-to-roll processing, wherein the substrate is provided with a support. Alternatively, the substrate may be supplied in discrete sheets that are handled and stored in relatively flat sheets. The substrate may be planar in shape as the material is deposited thereon. This may be the case, when the substrate is provided in the form of discrete sheets, not being transferred to or from a roll. The sheets may each be mounted on a carrier, having greater structural rigidity. This may allow for thinner substrates to be used than in the case of substrate film held on a roller. It may be that the substrate is a sacrificial substrate. It may be that the substrate is removed before the layer(s) of material. Part or all of the substrate may be removed before integrating the crystalline layer or a part thereof in an electronic product package, component or other end product. For example, the layer of crystalline material may be lifted off from the substrate. There may be a layer of other intervening material between the base substrate and the crystalline material. This layer may lift off with the crystalline material or assist in the separation of the crystalline material from the base substrate. A laser-based lift-off technique may be used. The substrate may be removed by a process that utilises laser ablation.

Similar techniques are described in the prior art. For example, KR20130029488 describes a method of making a battery including using a sacrificial substrate and laser radiation to harvest a battery layer. In other examples, another suitable processing regime is used, provided it is capable of sufficiently high production throughput.

The polymer substrate 128 is under tension when moving through the system, for example withstanding a tension of at least 0.001N during at least part of the processing. The polymer is robust enough such that when the polymer is fed through the roll-to-roll machine, it does not experience deformation under tensile stress. In this example, the polymer is Polyethylene terephthalate (PET), and the substrate 128 has a thickness of 1 micron or less, in examples the thickness is 0.9 microns. The substrate 128 is pre-coated with a current collecting layer, which is made of an inert metal. In this example, the inert metal used as the current collecting layer is platinum. The yield strength of the PET film is sufficiently strong that the substrate does not yield or plastically deform under the stresses of the roll-to-roll handling apparatus. The inert metal used in other examples can alternatively be gold, iridium, copper, aluminium or nickel.

The use of such thin polymer substrates is beneficial because this facilitates batteries with a higher energy density to be manufactured. In other examples, a material, which is not polymeric, is used, providing that it can be manufactured in a sufficiently thin and flexible manner to allow for a high battery density and ease of handling post-deposition.

The plasma deposition process and subsequent manufacturing processes are however subject to the technical challenges that working with such thin layers impose.

Before the substrate 128 is so pre-coated, it has a surface roughness that is carefully engineered so as (a) to be great enough to mitigate the undesirable effects that would otherwise result from electrostatic forces (such as increasing the force required to unwind the polymer film from the drum on which it is held) and (b) to be small enough that the roughness does not cause problems when depositing material onto the substrate. In this example, the surface roughness is engineered to be about 50 nm. It will be noted that the product of the thickness of the substrate (0.9 microns) and the surface roughness is $4.5 \times 10^4$ nm² and is therefore less than $10^5$ nm² and less than $5 \times 10^4$ nm² in this example. It has been found that that the roughness needed for easing handling of thin films rises with decreasing thickness. Generally, it has been found that the roughness required to improve handling of thinner substrates (i.e. less than 10 microns, particularly less than 1 micron) increases as the substrate thickness decreases.

Figure 1C:
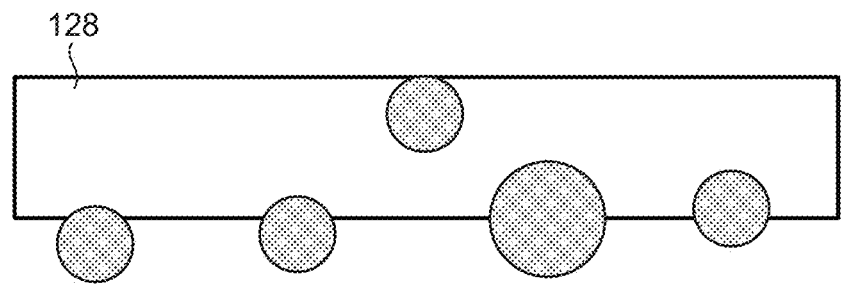
FIGS. 1c to 1h are schematic illustrations of various polymer substrate materials in cross-section.

FIG. 1c shows (not to scale) a typical thin-film polymer being about 1 micron thick and having embedded particles providing roughness. The roughness of the surface features provided by the particles is at least 90 nm and possibly higher. This is too rough for the particular example envisaged (although may be acceptable for other examples).

Figure 1D:
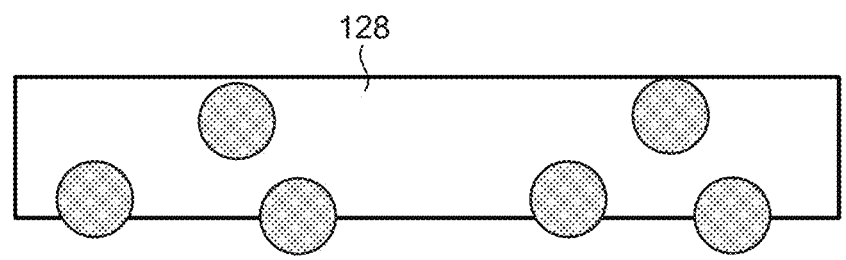

FIG. 1d shows (not to scale) one way in which the desired roughness can be achieved. Spherical particles of polystyrene are embedded in the substrate material such that at least 90% of those which contribute to the roughness of the substrate protrude from the local substrate surface by no more than half the volume of the particle. The particles have a diameter of about 90 nm. Thus, a majority of the embedded particles that contribute to surface roughness of the substrate have a median size of about 180% of the surface roughness of the substrate. In other examples, the embedded spherical particles are made of different material, such as silicon oxide.

Figure 1E:
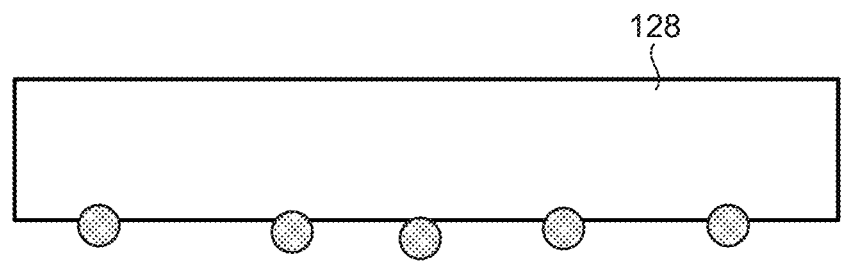

FIG. 1e shows (not to scale) an alternative way in which a desired roughness can be achieved. Spherical embedded particles of polystyrene are present on the surface of the substrate material such that at least 90% of those which contribute to the roughness of the substrate protrude from the local substrate surface by more than half the volume of the particle. The particles used in the example of FIG. 1e are smaller than those used in the example of FIG. 1d.

Figure 1F:
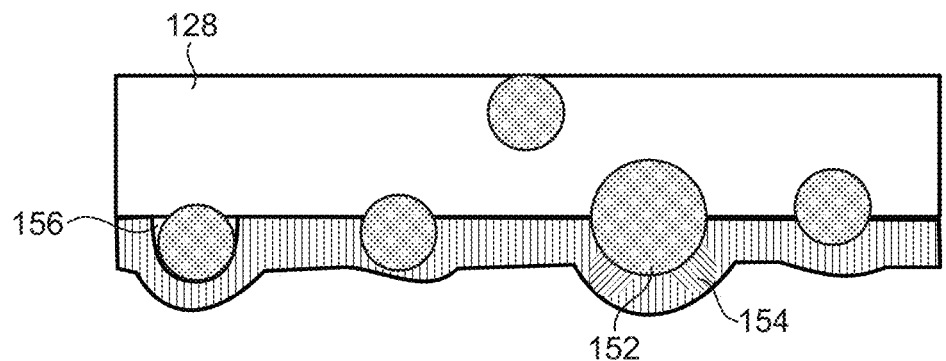
Figure 1G:
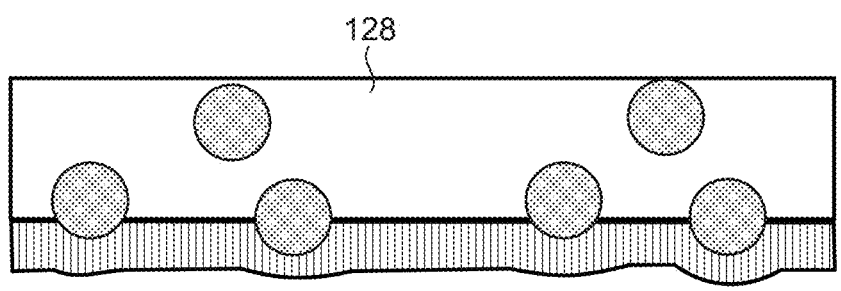
Figure 1H:
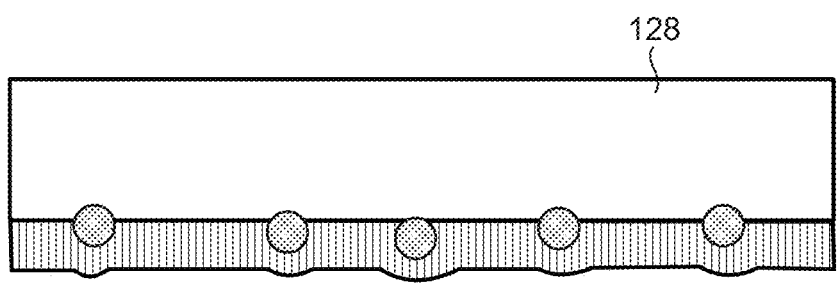

Examples such as those of FIGS. 1d and 1e enable good quality films to be deposited, as crystalline material, on thin substrates in a manufacturing environment. The advantages of the presence of embedded particles are retained, but by careful control of the location and size distribution of such particles, the potential disadvantages can be avoided or reduced. FIGS. 1f to 1h show schematically a cross-section corresponding to the substrate shown in FIGS. 1c to 1e after a layer of crystalline material has been formed on the substrate surface. The intermediate layer of metal current collector is omitted from FIGS. 1f to 1h. The roughness of the substrate shown in FIGS. 1c and 1f is such that problems arise. The dominating protrusions caused by certain embedded particles 152 cause shadowing and competing crystal growth, which are illustrated schematically by means of the contrasting shading 154 in FIG. 1f. This competing crystal growth which is aligned in a conflicting direction gives rise to discontinuities in the layer that affects performance of the final product. Also, there is a surprisingly profound effect on the likelihood of delamination of the layer of deposited material from the substrate. This may be as a result of poor contact between the deposited layer and the underlying substrate in the region near to any embedded particles that protrude far from the median plane of the surface (illustrated schematically by the voids 156 in FIG. 1f), where the local asperity radius is small. In contrast, it can be seen from FIGS. 1g and 1h that no such problems arise. The roughness of the surface of the material deposited on the substrate is approximately 50 nm.

The roughness of the substrate can be measured with a profilometer. This instrument has a stationary stylus. The surface to be measured is translated under the stylus, and the deflections of the stylus measure the surface profile, from which various roughness parameters are calculated.

Roughness can also be measured using "non-contact" methods. A suitable machine for measuring roughness is the "Omniscan MicroXAM 5000B 3d" which uses optical phase shift interference to measure the surface profile.

The roughness, Ra, can be calculated using the formula $$Ra = \frac{1}{n}\sum_{i=1}^{n}|y_i|$$

where the deviation y from a smooth surface is measured for n data points.

The surface roughness, Sa, of an area A extending in the x- and y-directions can be calculated using the formula:

$$Sa = \frac{1}{A}\int\int_A |X(x,y)|dxdy$$

where Z is the deviation from a mathematically perfectly smooth surface.

In the present example, the average surface roughness is measured with a non-contact method.

The remotely generated plasma is created by the power supplied to the antennae 116 by power supply 112. There is therefore a measurable power associated with that used to generate the plasma. The plasma is accelerated to the target by means of electrically biasing the target 104, there being an associated electrical current as a result. There is thus a power associated with the bias on the target 104. In this example, the ratio of the power used to generate the plasma to the power associated with the bias on the target is greater than 1:1, and optionally greater than 1.0:1.0. Note that in this example, the ratio is calculated on the assumption that the power efficiency of the plasma-generating source is taken to be 50%. The power associated with the bias on the target is at least 1 $Wcm^{-2}$. Ideally, the plasma source is an inductively coupled plasma source or helicon source such that the active temperature of the plasma is low and the directional momentum of species within the plasma is not a hindrance to the deposition system.

In further examples, the ratio of the power used to generate the plasma to the power associated with the bias on the target is greater than 1:1, and no more than 7:2, optionally 7.0:2.0. In yet further examples, the power associated with the bias on the target is greater than 1:1 and no more than 3:2, optionally 3.0:2.0. In some examples, the power efficiency of the plasma generating source is taken to be 80%. In some examples, the power associated with the bias on the target is 10 $Wcm^{-2}$. In yet further examples, the power associated with the bias on the target is 100 $Wcm^{-2}$. In yet further examples, the power associated with the bias on the target is 800 $Wcm^{-2}$. In other examples, the efficiency of the plasma generating source may be different, and the power ratio may also be different.

When the $LiCoO_2$ film is deposited onto the substrate, it forms a crystalline film of $LiCoO_2$. The crystalline structure which forms onto the substrate is in the R3̄m space group. This structure is a layered oxide structure. This structure has a number of benefits, such as having a high accessible capacity and high rate of charge and discharge compared to the low energy structure of $LiCoO_2$, which has a structure in the Fd3m space group. Crystalline $LiCoO_2$ in the R3̄m space group is often favoured for solid state battery applications.

Throughout the plasma deposition process, the temperature of the substrate 128 does not exceed the degradation point of the polymer substrate 128. Moreover, the temperature of the substrate is sufficiently low throughout the deposition process such that the temperature adjusted yield stress of the polymer substrate remains sufficiently high such that the polymer substrate does not deform under the stresses exerted by the roll-to-roll processing machine.

The general shape of the confined plasma made from the remote plasma generator 106 is shown by the dashed lines B in FIG. 1a. The series of electromagnets 108 is used to and confine the plasma to a desired shape/volume.

It should be noted that, whilst in this first example, substrate 128 is fed into the chamber at inlet 130, and exits the chamber at outlet 132, alternative arrangements are possible. For example, the roll or other store upstream of shutter 136 may be inside the process chamber 122. The roll or other store downstream of shutter 136 may be inside or could be stored inside the process chamber 122.

In addition the means 112 of powering the plasma source, may be of RF, (Direct Current) DC, or pulsed-DC type.

In this first example, the target assembly 102 comprises only one target 104. This target is made of $LiCoO_2$. It should be appreciated that alternative and/or multiple target assemblies may be used, for example, comprising a distinct region of elemental lithium, a distinct region of elemental cobalt, a distinct region of lithium oxide, a distinct region of cobalt oxide, a distinct region of a LiCo alloy, a distinct region of $LiCoO_2$, or any combination thereof. In other examples, the $ABO_2$ material may not be $LiCoO_2$. In these examples, the target assembly or assemblies contain distinct regions of A, distinct regions of B, distinct regions of a compound containing A and/or B, and/or distinct regions containing $ABO_2$.

For the avoidance of doubt, the target 104 of the target assembly 103 acts as a source of material alone and does not function as a cathode when power is applied to it from the RF, DC or pulsed DC power supply.

In this example, the working pressure of the system is 0.0050 mBar. The theoretical mean free path of the system is approximately 10 cm. The theoretical mean free path is the average distance between collisions for an ion in the plasma. The working distance between the target 104 and substrate 128 is approximately 8.5 cm. This working distance is therefore approximately 85% of the theoretical mean free path of the system.

In this example, the working pressure is above a lower bound below which crystalline material in the layered oxide structure does not form, but below an upper bound above which observable damage is caused to the substrate. The working distance is shorter than an upper bound above which crystalline material in the layered oxide structure does not form, and longer than a lower bound below which the energy of the deposition causes observable damage to the substrate, or unfavourable oxide states to form.

The average crystallite size of the crystallites which form on the film in this example is around 20 nm. In other examples, the average crystallite size of the crystallites which form on the film is around 50 nm.

In an alternative example, the working pressure of the system is 0.0020 mBar. The theoretical mean free path of the system is approximately 12 cm. The working distance between the target 104 and substrate 128 is approximately 9 cm. This working distance is therefore approximately 75% of the theoretical mean free path of the system.

In an alternative example, the working pressure of the system is 0.0065 mBar. The theoretical mean free path of the system is approximately 15 cm. The working distance between the target 104 and substrate 128 is approximately 7.5 cm. This working distance is therefore approximately 50% of the theoretical mean free path of the system.

Figure 2A:
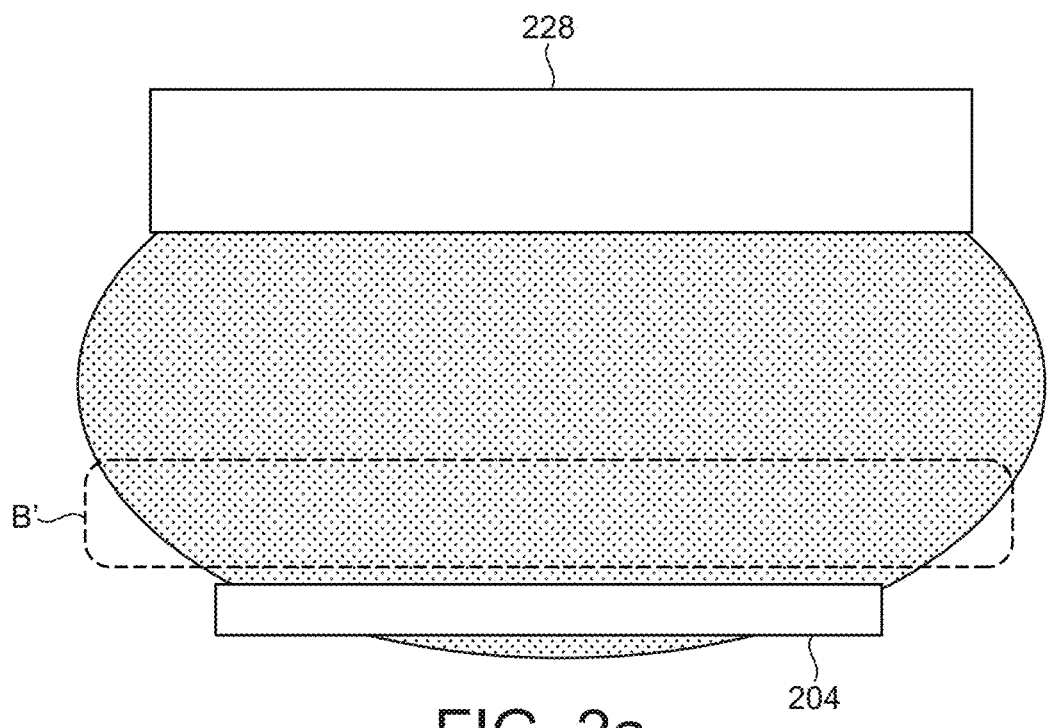
FIG. 2a is a schematic side-on view of a plasma deposition chamber used in accordance with a second example method.

A second example method uses the apparatus shown in FIG. 2a. The main differences between the apparatus of FIG.

1a and the apparatus of FIG. 2a will now be described. FIG. 2a shows that instead of the flexible substrate 128 presented in the first example, an inflexible planar glass substrate 228 is used. Furthermore, no shutter is present in this example. The thickness of the glass substrate is in the order of 5 millimetres. A single target 204 is used in this example. A thermal indicator sticker was attached to the face of the glass slide opposite to that on which the cathode material was deposited. The thermal indicator sticker is configured to indicate whether or not the substrate 228 experienced a temperature of 270° C. or more during the plasma deposition process. After deposition, the sticker indicated that the substrate did not experience a temperature of 270° C. or more during the deposition process. The general shape of the plasma is indicated by the area enclosed by the broken line B' in FIG. 2a.

Table 1 shows the properties of the resultant exemplary battery cathodes produced in accordance with the second example:

TABLE 1 properties of LiCoO$_2$ cathode films as a function of deposition parameters

| Example identifier | Target composition | Measured film Composition (At %) | | | Plasma source power (W) | Sputtering Power (W) | Process pressure (mBar) | Ar process flow rate (SCCM) | Film thickness (nm) | Film Roughness Sa (nm) | Dep time (min) |
|---|---|---|---|---|---|---|---|---|---|---|---|
| | | O | Co | Li | | | | | | | |
| Sample 1 | LiCoO$_2$ | 56 | 21 | 23 | 1800 | 500 | 3.90e−03 | 52 | 910 | 51.8 | 100 |
| Sample 2 | LiCoO$_2$ | 55 | 21 | 24 | 1800 | 800 | 3.90e−03 | 52 | 915 | 106 | 100 |

In Table 1 above, the elemental film composition was determined by x-ray photoelectron spectroscopy using a Thermo Fisher K-alpha spectrometer with a MAGCIS ion gun. Quoted compositions were taken from depth profiling measuring at about 10 levels with a film. Plasma source power is the electrical power supplied to generate the plasma. Sputtering power is the electrical power applied to the target 204. Process pressure is the pressure in the chamber. Film thickness and roughness measurements were taken after deposition, using an Omniscan MicroXAM 5000b 3d optical profiler. Film thicknesses were measured after deposition, as step-heights at masked edges and roughness measurements were taken from sample areas of about 400 microns×500 microns.

Figure 2B:
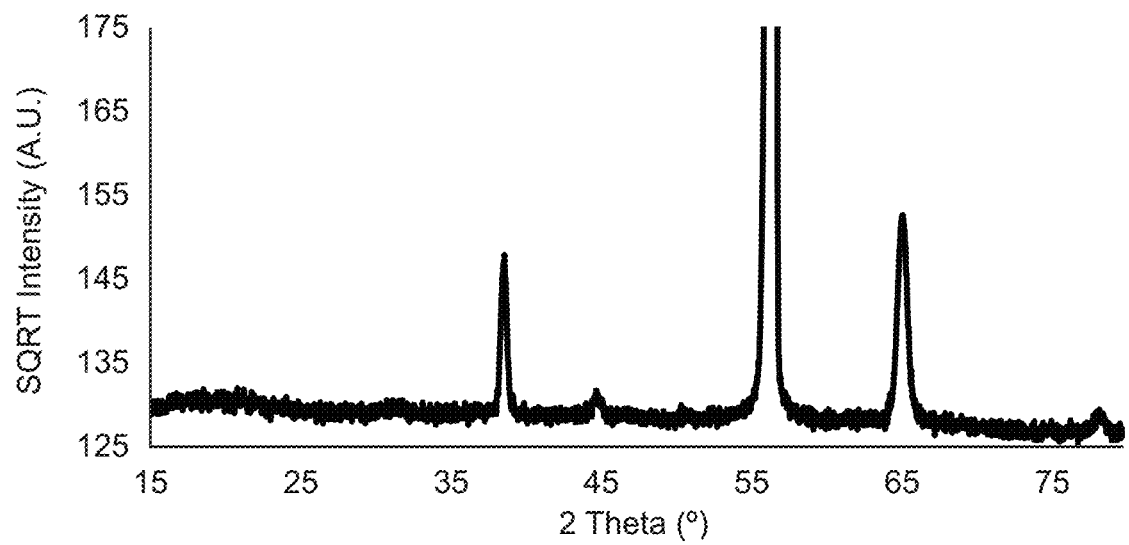
FIG. 2b is an X-ray diffraction (XRD) spectra of a first sample of a battery cathode made in accordance with the method of the second example.

FIG. 2b shows an X-ray diffraction (XRD) spectra of the battery cathode of Sample 1. The structure of the film was characterised by X-ray diffraction using a diffractometer (Rigaku-Smartlab) with nickel filtered CuKα radiation (λ=1.5406 Å). The diffraction pattern was taken at room temperature in the range 10°<2θ<80° using a fixed incident angle of <5°. Data were collected using step scans with a resolution of 0.04°/step and a count time of 0.5 s/step. The peak at approximately 37° is associated with the (101) plane of the crystals being substantially orientated parallel to the substrate surface. The peak at approximately 66° is associated with the crystals being substantially oriented such that the (110) plane is parallel to the substrate. The peak at approximately 55° is associated with the glass substrate, and for the purposes of determining the crystal structure of the LiCoO$_2$, should be ignored.

The absence of extra reflections associated with the Fd3m space group is an initial indicator that the LiCoO$_2$ deposited is in the R$\bar{3}$m space group.

Also notably absent is the peak associated with the (003) plane. This implies that very few crystals are orientated in such a way that the (003) plane is parallel to the substrate surface. It is beneficial that very few crystals are orientated in this way. A detailed explanation is beyond the scope of the present application, but briefly, the accessible capacity of a cathode increases when a higher proportion of the crystals are aligned such that the (101) and (110) planes are parallel to the substrate, as opposed to being aligned such that the (003) plane is parallel to the substrate as the apparent resistance to ion migration is lower. The crystals have formed such that the longitudinal axis of the crystals is normal to the substrate. In other words, the crystals have formed in an epitaxial manner.

The applicant has discovered that if the ratio of the power used to generate the plasma to the power associated with the biasing of the target is more than 1:1, then generally a crystalline material is deposited. In Sample 1, the ratio is 1800:500 (3.6:1) and in Sample 2, the ratio is 1800:800 (9:4). Note that in this example, the ratio is calculated on the assumption that the power efficiency of the plasma-generating source is taken to be 50%.

In a comparative example, the experiment was repeated with a plasma source power of 1 kW and a power associated with bias to the target of 1 kW. The material deposited was substantially amorphous. The performance of the film of the comparative example as a cathode was investigated by depositing an electrolyte (in this case, LiPON) and an anode metal on top of the cathode layer, thereby making a solid state battery. The charge-discharge characteristics of the battery were investigated and were found to be poor, with a cathode specific capacity of about 10 mAh/g. When analogous batteries were made using crystalline LiCoO$_2$ such as that formed in Sample 1 and Sample 2, the charge-discharge characteristics were far superior, with typical cathode specific capacities of about 120 mAh/g.

Figure 2C:
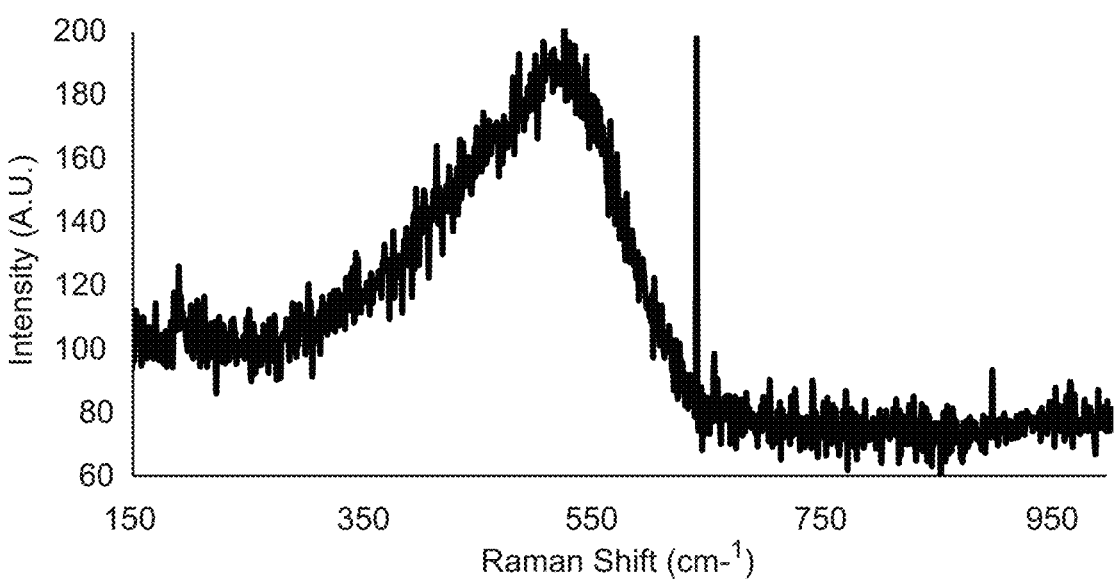
FIG. 2c is a Raman spectra of a battery cathode from which the XRD data of FIG. 2b are obtained.

FIG. 2c shows a Raman spectra of the battery cathode of Sample 1. The bonding environment of the films was characterised by Raman Spectrocopy. Raman spectra were collected using a JY Horiba LabRAM ARAMIS imaging confocal Raman microscope using 532 nm excitation. Note that the strong sharp peak at 600 cm$^{-1}$ can be considered as anomalous due to the unphysical nature of the sharpness of the peak. The strong, characteristic peak observed at 487 cm$^{-1}$ is well known in the art to be associated with the R$\bar{3}$m space group crystal structure of LiCoO$_2$.

Figure 2D:
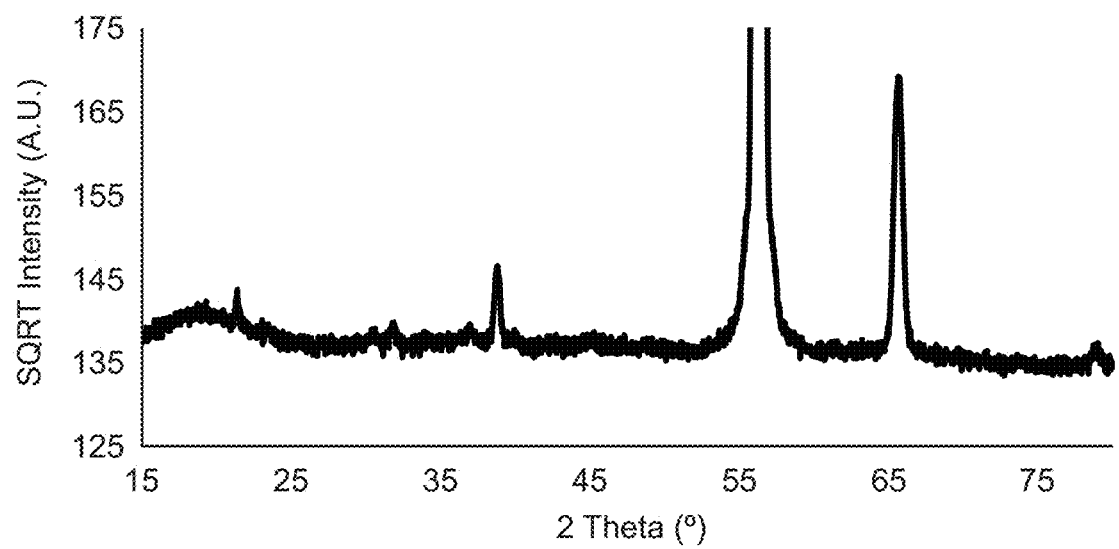
FIG. 2d is an XRD spectra of a second sample of a battery cathode made in accordance with a method of the second example.
Figure 2E:
FIG. 2e is a Raman spectra of the battery cathode from which the XRD data of FIG. 2d are obtained.

FIG. 2d shows an XRD spectra (collected in the same way as that for Sample 1) of the cathode of Sample 2. The spectra shown is similar to that shown in FIG. 2b. However, in FIG. 2d, the relative intensity of the peak at approximately 66° is far stronger than that of the peak at 37°. This indicates that the number of crystals with their (110) planes parallel to the substrate is higher than the number of crystals with their (101) planes parallel to the substrate for Sample 2. This is beneficial as it means that the ion channels of the thin film are orientated perpendicular to the substrate, making for easier for intercalation and de-intercalation of the ions from their interstitial sites from within the crystal structure of the cathode. This improves the accessible capacity and the rate of charge of the cathode. FIG. 2e is a Raman spectra of the cathode of Sample 2; the same comments apply to FIG. 2e that apply to FIG. 2c.

Figure 3A:
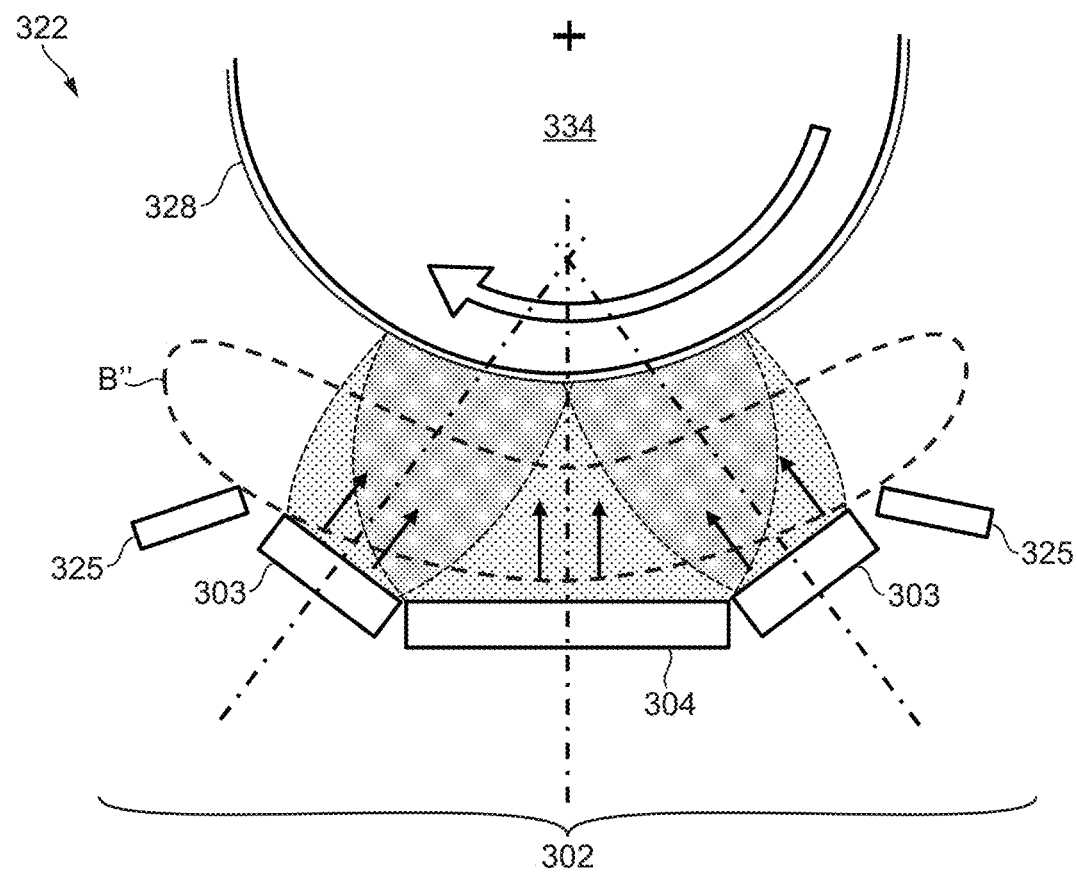
FIG. 3a is a schematic side view of a plasma deposition chamber used in a method in accordance with a third example.
Figure 3B:
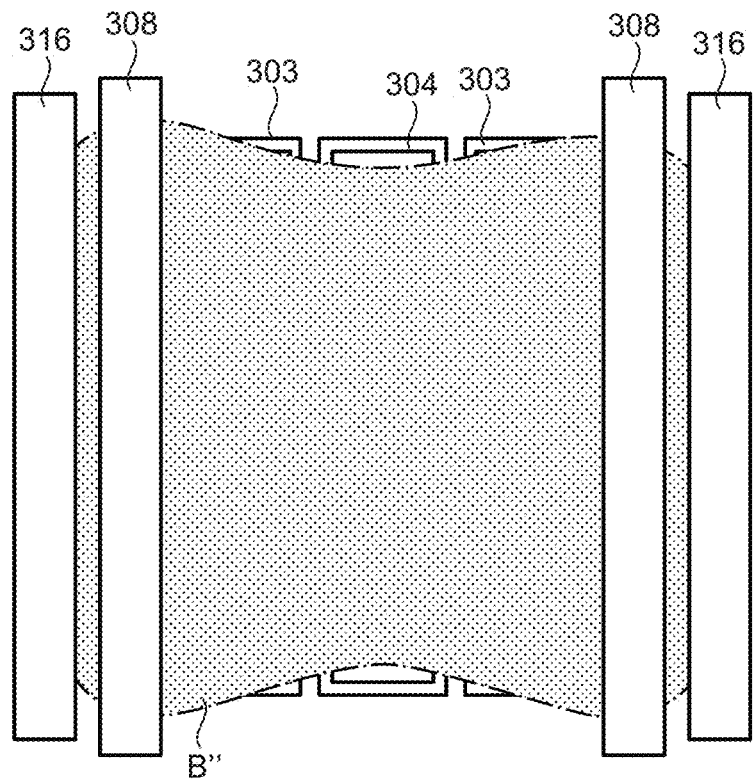
Figure 3C:
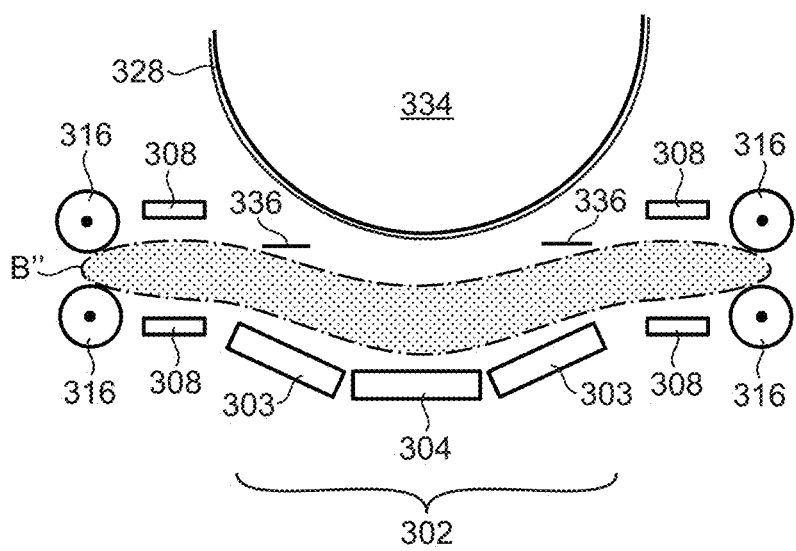
FIG. 3c is a further schematic side view of the plasma deposition chamber shown in FIGS. 3a and 3b.

FIGS. 3a to 3c show an alternative example of an apparatus for use in another example of a method of manufacturing a layer of crystalline material on a surface using plasma sputtering according to a third example. The apparatus and method of manufacture employed is similar to that described with reference to the first example. Only the significant differences will now be described. The same parts are labelled with reference numerals sharing the same last two digits. For example, rotating drum 334 in FIG. 3a is the same as rotating drum 134 in FIG. 1a. The apparatus of FIG. 3a comprises a rotating drum 334 on which a polymer substrate 328 is supported within a region defined by a process chamber 322 (the walls of the chamber being omitted for the sake of clarity). The target assembly 302 comprises a plurality of targets. There is provided a first target 304 consisting of elemental lithium and a plurality of targets 303 consisting of elemental cobalt (referred to now as the second targets). The targets are all positioned at a working distance of about 10 cm from the substrate 328 (the working distance being shortest separation therebetween). The surface of each target 303, 304 facing the drum 334 is flat (and planar). The radius of the drum 334 is significantly greater than the working distance (the size of the drum 334 being shown in the Figures as being relatively smaller than it is in reality for the sake of the illustration). The targets 303, 304 are arranged circumferentially around the circumference of the drum 334. The apparatus also comprises a shutter 336, for restricting deposition of sputtered material onto the substrate 328.

A plasma of argon ions and electrons is generated by means of two electrically powered spaced apart antennae 316. The plasma is confined and focused by a magnetic field controlled by two pairs of electromagnets 308, each pair being positioned proximate to one of the antennae 316 and the electric field generated by the system. The overall shape of the plasma (the 90% highest concentration of which being illustrated in highly schematic fashion in FIG. 3c by the plasma cloud B") is that of a blanket, in that the length and width of the plasma cloud are much greater than the thickness. The width of the plasma is controlled in part by the length of the antennae 316. The two pairs of antennae 316 are separated by a distance that is comparable to the length of the plasma. The length and width of the plasma are in the same general direction as the length and width, respectively, of the substrate.

The plasma source is spaced apart from the targets, and may thus be considered as a remotely generated plasma. The theoretical mean free path of the system (that is, the average distance between collisions for an ion in the plasma) is about 12 cm, meaning that the majority of particles travel from the target to the substrate without colliding with any argon ions in the plasma.

FIG. 3a is a partial schematic cross-sectional view showing part of the substrate travelling on the drum 334 and also shows schematically the trajectories of particles that travel from the targets 303, 304 to the substrate. Thus, there is a first plume corresponding to the trajectories of particles from the first target 304 to the surface of the substrate 328 and a second plume corresponding to the trajectories of particles from the second target 303 to the surface of the substrate 328. The first plume is shown as a spotted region and each second plume is shown as a solid grey region. It will be seen from FIG. 3a that the first plume and the second plume converge at a region proximate to the substrate. It will also be seen in FIG. 3a that the first target 304 faces towards the substrate in a first direction (defined in this example by the notional line extending from the centre of the surface of the target 304) and the adjacent second target 303 to the left as shown in FIG. 3a, faces towards the substrate in a second direction (defined in this example by the notional line extending from the centre of the surface of the target 303). The first and second directions converge towards the substrate and intersect at a location just beyond the substrate (the location being about 3 cm beyond the substrate). Oxygen gas is supplied at a controlled rate into the process chamber 322 through inlets 325. The targets are stationary as the substrate moves with rotation of the drum. In other examples, the inert sputtering gas is introduced through the gas inlet (not shown here, but substantially the same configuration as that shown in FIG. 1a).

The amount of oxygen introduced into the chamber may be reduced in some other examples if distinct regions of lithium oxide and cobalt oxide are present in targets 304, 303, and the oxygen content in such targets may be sufficiently high in some examples such that no additional oxygen gas need be introduced into the chamber 322 at all.

FIG. 3b is a view looking from the drum towards the targets. FIG. 3c is a cross-sectional view that includes sections of the first target 304, the second targets 303 and the substrate 328 on the drum 334.

It will be seen that in FIG. 3c (the view of the cross-section) the first target 304 is angled relative to each of the second targets 303.

In performance of the method, the plasma generated is used to sputter material from the first target and from the second targets onto the substrate.

Figure 3D:
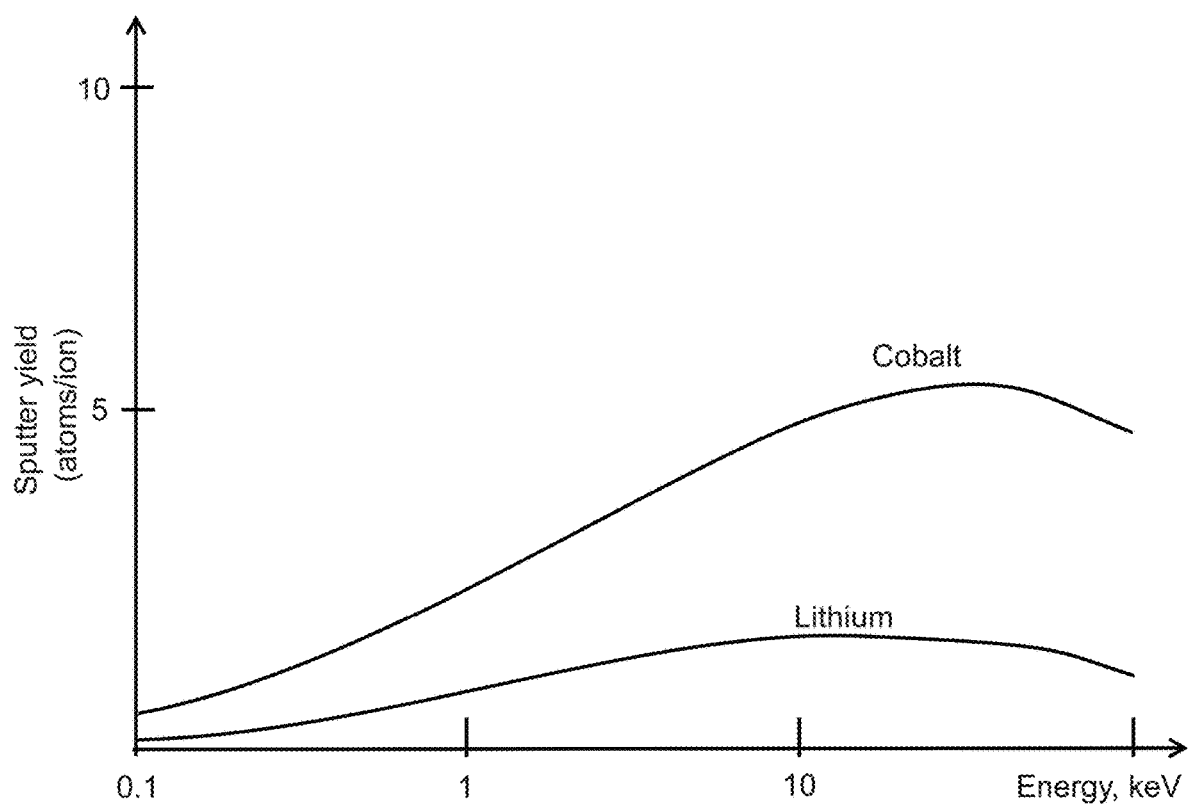
FIG. 3d is a graph comparing sputter yields of cobalt and lithium as a function of energy.

As shown in FIG. 3d, elemental lithium material has a lower sputter yield than cobalt as measured in atoms yielded per ion received at the surface at a given energy (less than half at 10 keV). As such, the (negative) potential applied to the first target has a magnitude greater than the potential applied to the second targets. The first target also has a slightly larger surface area exposed to the plasma than the sum area of the second targets. As such, the number of ionised Li atoms arriving at the substrate per unit is substantially the same as the number of ionised Co atoms arriving at the substrate per unit. Ionised oxygen atoms are also present as are electrons from the plasma. The high energy particles made possible by the remote plasma allows for crystalline $LiCoO_2$ material, having a hexagonal crystal structure, to be formed in situ on the surface of the substrate.

A greater number of high energy particles from the plasma are received at the first target 304 (over the whole surface area of the target) than at the second targets 303 (summed over the whole surface area of both second targets).

Figure 3E:
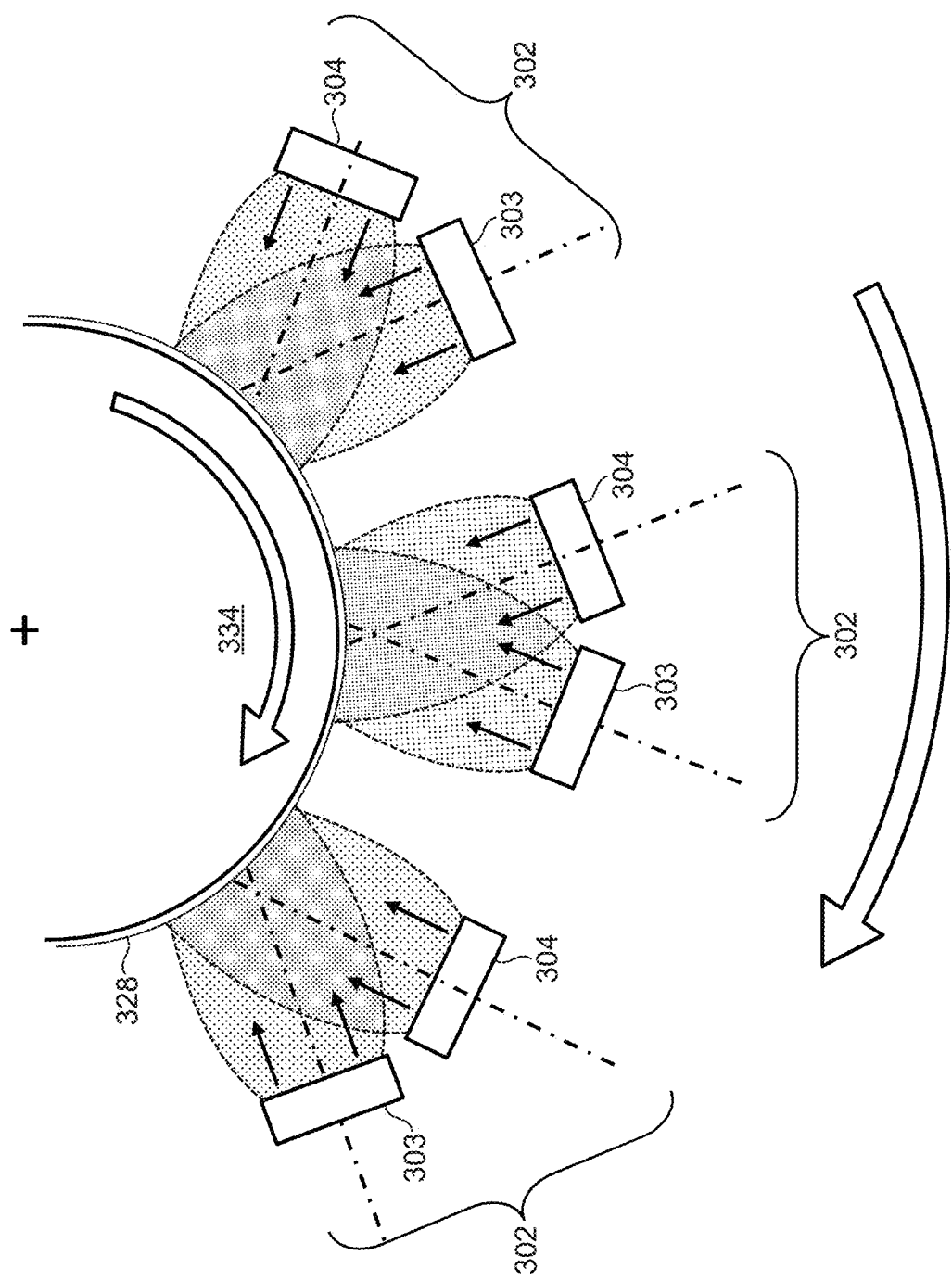
FIG. 3e is a schematic side view of a plasma deposition chamber used in a method in accordance with a fourth example.

FIG. 3e shows a schematic cross-section through a further example of an apparatus in accordance with a fourth example, similar to that shown in FIGS. 3a to 3c, but in which the targets move and are arranged in pairs, circumferentially around the drum 334. Each pair of targets (i.e. each assembly 302) is arranged to be angled to face towards a location very near to the substrate on the drum. Each pair 302 comprises a first target 304 of elemental lithium and a second target of elemental cobalt 303. The targets are all positioned at a working distance of about 15 cm from the substrate, the working distance being the shortest separation therebetween. The theoretical mean free path of the system (that is, the average distance between collisions for an ion in the plasma) is about 20 cm. For each pair of targets (302), in use there is a first plume of particles from the first target (304) and a second plume of particles from the second target (303) which converge at a region proximate to the substrate. The centre of rotation of the main drum 334 is also the centre of rotation of the targets. The targets move with an angular velocity about the centre of rotation slower than the drum. Targets may be replaced when they have moved out of the plasma on a rotating basis, thus allowing for constant deposition of material on the moving substrate.

An example of a battery cathode made in accordance with the second example will now be described with reference to FIGS. 4a, 4b and 5a. The substrate 428, 528 comprises a current collecting layer 429, 529, in this case, a layer of platinum, on which a layer of $LiCoO_2$ 442, 542 is deposited. In other examples, another inert metal is used as a current collecting layer, for example gold, iridium, copper, aluminium or nickel. In yet further examples, the current collecting layer may be carbon based. In some examples, the current collecting layer is surface modified, and in some examples, the current collecting layer comprises rod-like structures.

Figure 4A:
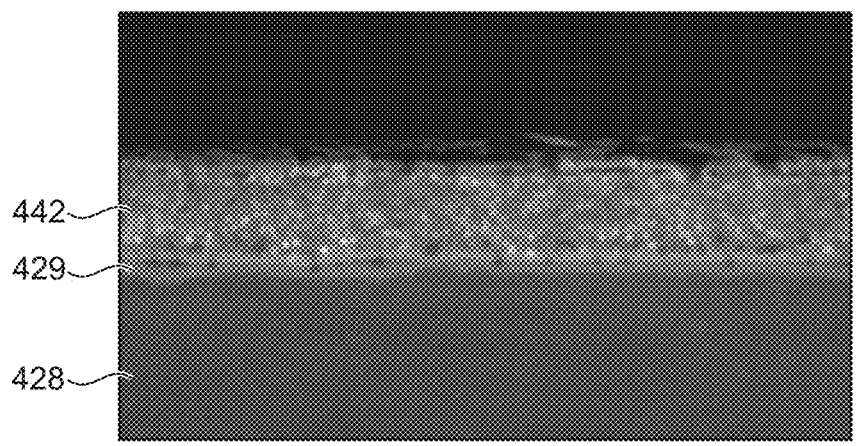
FIG. 4a is a cross-sectional scanning electron micrograph of a battery cathode relating to a first sample made using in accordance with the method of the second example.
Figure 4B:
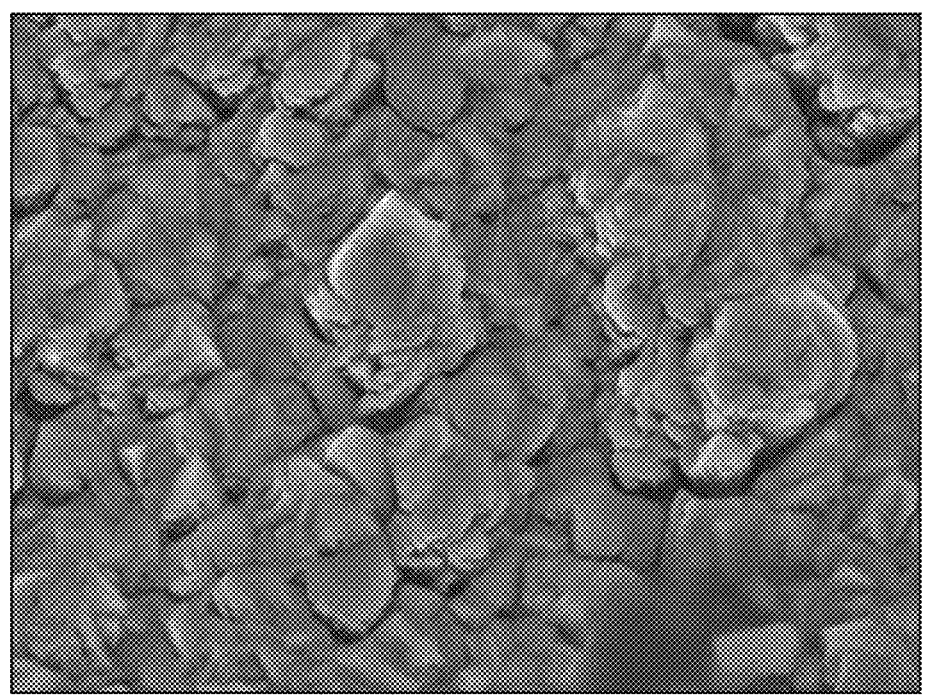
FIG. 4b is a birds-eye view of a scanning electron micrograph of a battery cathode relating to a second sample made in accordance with the method of the second example.
Figure 5A:
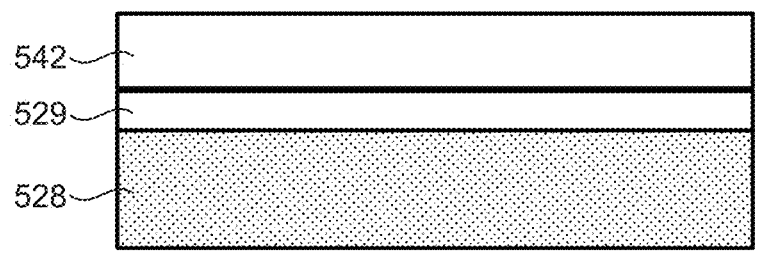
FIG. 5a is a schematic cross-section through a battery cathode relating to a first sample made using a method of a fifth example.

As shown on the Scanning Electron Microscope (SEM) image of FIG. 4a (cross sectional view of a first sample deposited film) and FIG. 4b (bird's-eye view a second sample deposited film), the $LiCoO_2$ film layer 442, 542 of both samples is polycrystalline in nature. The battery cathodes of FIGS. 4a, 4b and 5a can also be made in accordance with the methods of the third or fourth example.

Figure 5B:
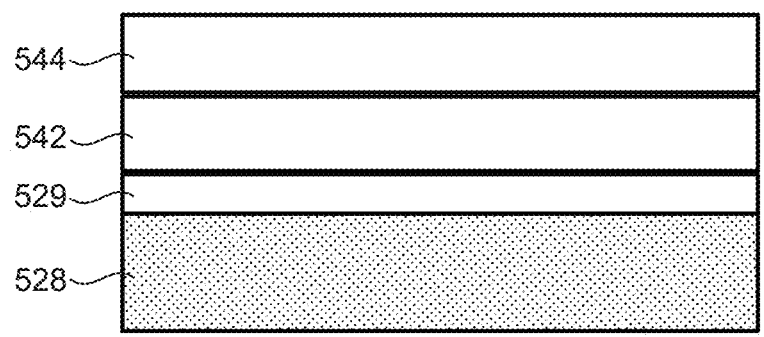
FIG. 5b is a schematic cross-section through a battery cathode relating to a second sample made using the method of the fifth example.
Figure 5C:
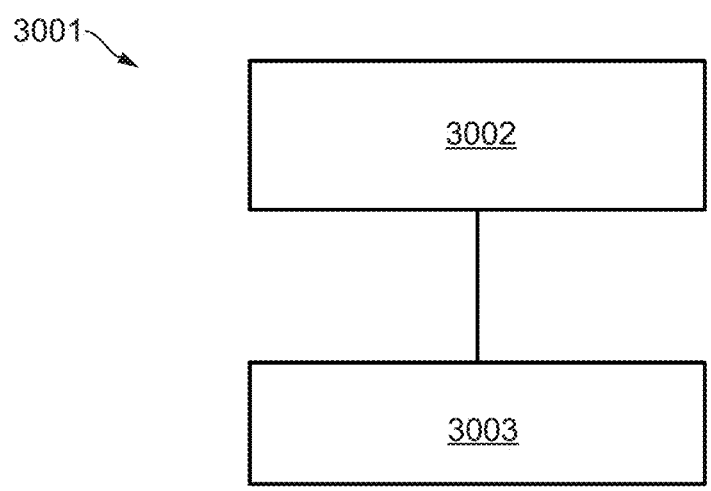
FIG. 5c shows the steps of a method of manufacturing a battery cathodic half-cell in accordance with the fifth example.

A method of making a cathodic half-cell in accordance with a fifth example will now be described with reference to FIG. 5a (a first sample), FIG. 5b (a second sample), and FIG. 5c. The method, generally described by reference numeral 3001, comprises depositing 3002 a battery cathode material 542 onto a substrate (which in this example comprises a current collecting layer 529), and depositing 3003 onto said battery cathode material 542 battery electrolyte material 544. In this example, the material deposited for the electrolyte 544 is lithium phosphorous oxy-nitride (LiPON). In other examples, the material deposited is another suitable electrolyte material. In some samples of the fifth example of the invention (such as the second sample), the half-cell may comprise an electrode material 544, and in other samples of the fifth example, the half-cell may not comprise an electrode material 544 (such as the first sample).

In this example, the LiPON is deposited in substantially the same way as the $ABO_2$ materials in the first, second, third or fourth examples, using a remotely-generated plasma. However, in this example, the target material used is $Li_3PO_4$, with deposition occurring in a reactive nitrogen atmosphere. In other examples, the target assembly may include a number of targets, with distinct regions of lithium and/or phosphorous containing compounds, elemental lithium, or lithium oxide. In other examples, the deposition additionally occurs in a reactive oxygen atmosphere.

Figure 6:
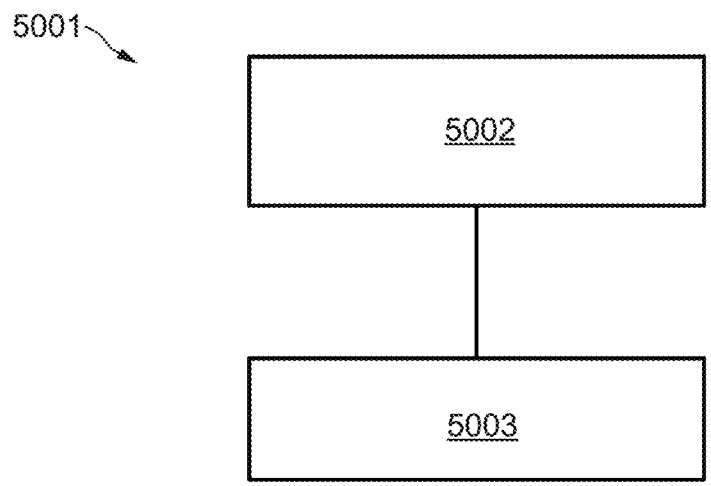
FIG. 6 is a schematic representation of an example of a method of making a battery cell in accordance with a sixth example.

An example of a method of making a solid-state battery cell in accordance with a sixth example will now be described with reference to FIG. 6. The method is denoted generally by reference numeral 5001 and comprises making 5002 a cathodic half-cell in accordance with the fifth example (for example, as described above with reference to FIGS. 5b and 5c) and contacting 5003 said cathodic half-cell with an anode. In this example, the anode is deposited by a convenient method, including remote plasma sputtering, magnetron sputtering, CVD etc. In other examples, the anode is deposited by thermal evaporation, e-beam evaporation, pulsed laser deposition, or simple DC-sputtering.

Figure 7A:
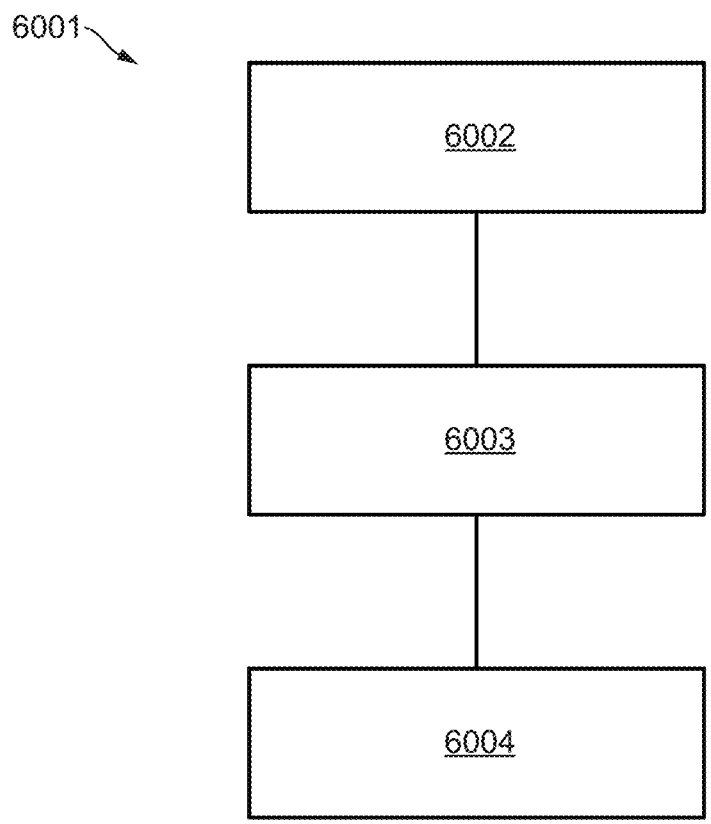
FIG. 7a is a schematic representation of an example of a method of manufacturing a solid-state thin film battery in accordance with a seventh example.
Figure 7B:
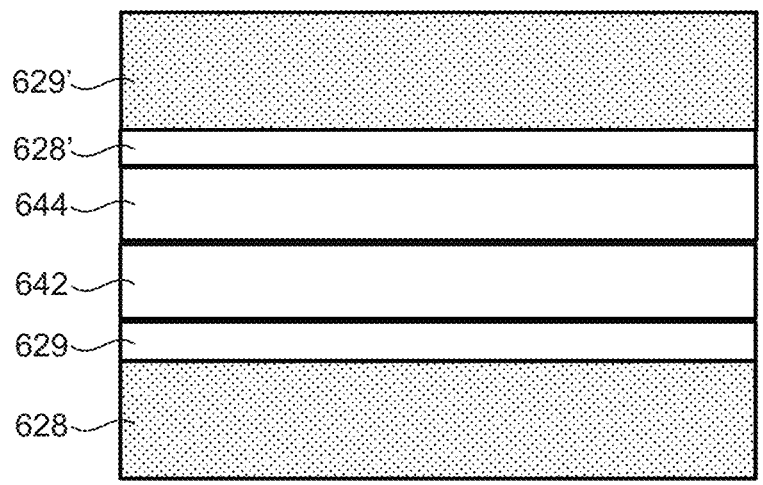
FIG. 7b is a schematic cross-section through a solid-state thin film battery in accordance with a first sample of the seventh example.

An example of a method of making a solid-state battery in accordance with a seventh example will now be described with reference to FIG. 7a. The method is denoted generally by reference numeral 6001 and comprises making 6002 a plurality of cathodic half-cells of a solid state thin film battery, making 6003 a plurality of anodic half cells of a solid state thin film battery and bringing 6004 said cathodic and anodic half cells into contact with one another, thereby forming at least one battery. A battery so made according to a first sample of the seventh example of the present invention is shown schematically in FIG. 7b. Referring to FIGS. 7b, 628 and 628' are substrate materials, 629 and 629' are current collecting layers, 642 is the cathode material, in this case, $LiCoO_2$, and 644 is LiPON, which acts as both electrolyte and anode.

Figure 7C:
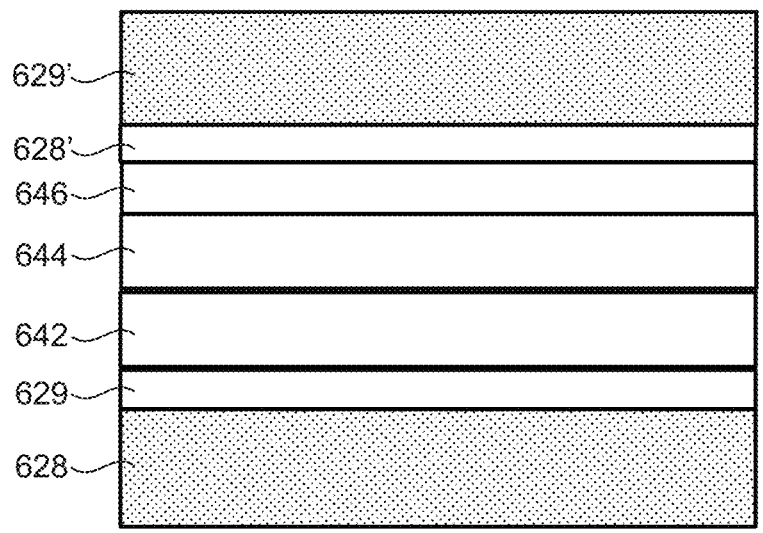
FIG. 7c is a schematic cross-section through a sample solid state thin film battery made in accordance with a second sample of the seventh example.

Alternatively, in other examples the current collector material acts as an anode material. Alternatively, in a second sample of the seventh example of the invention a further anode material may be deposited. This is shown schematically in FIG. 7c. Referring to FIGS. 7c, 628 and 628' are substrate materials, 629 and 629' are current collecting layers, 642 is the cathode material, in this case, $LiCoO_2$, 644 is LiPON, which acts as electrolyte, and 646 is a suitable anode material.

Figure 8A:
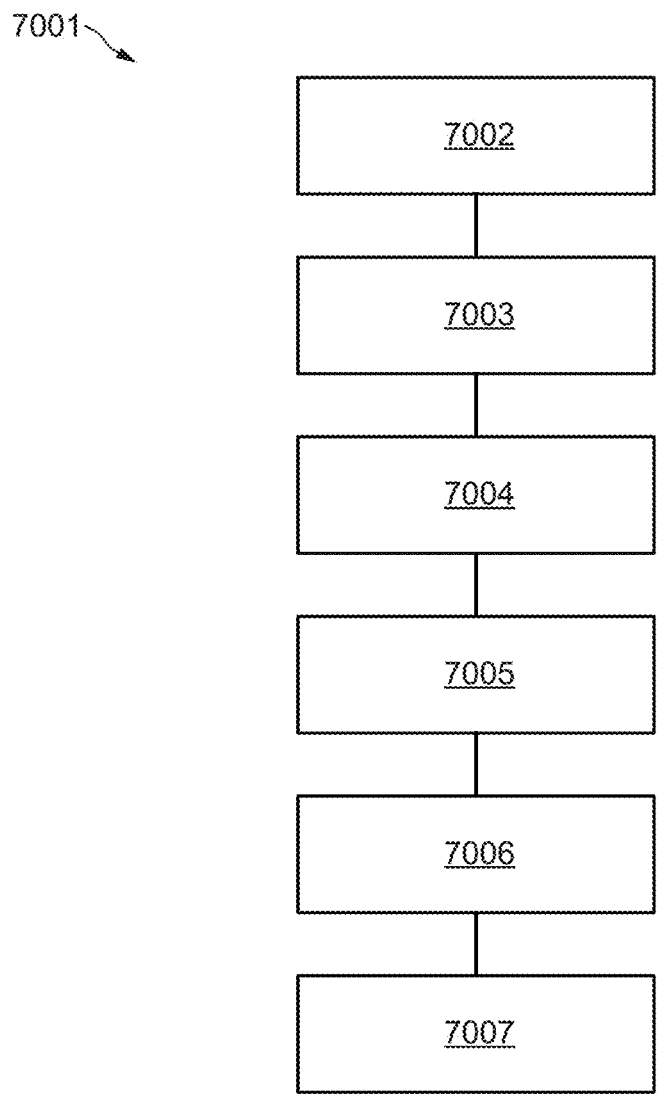
FIG. 8a is a schematic representation of a method of determining an optimum working distance for a remote plasma deposition system configured for the deposition of layered oxide materials in accordance with an eighth example.

An example of a method of determining an optimum working distance for a remote plasma deposition system configured for the deposition of layered oxide materials in accordance with an eighth example will now be described with reference to FIG. 8a. The method is generally described by numeral 7001 and comprises:

Selecting 7002 a range of working distances, wherein a working distance within said range is +/−50% of the theoretical mean free path of the system, for a number of test specimens, for each respective specimen, performing 7003 the method of depositing material according to the first example at different working distances within the selected range, performing 7004 a characterisation technique capable of determining a characteristic feature of a layered oxide structure on each of the test specimens after deposition has occurred, identifying 7005 specimens where said characteristic property is present;

from those specimens, selecting 7006 the specimen wherein the (normalised) intensity of said characteristic peak is highest, and subsequently selecting 7007 the working distance for the system to that which was used during deposition of said test specimen.

Figure 8B:
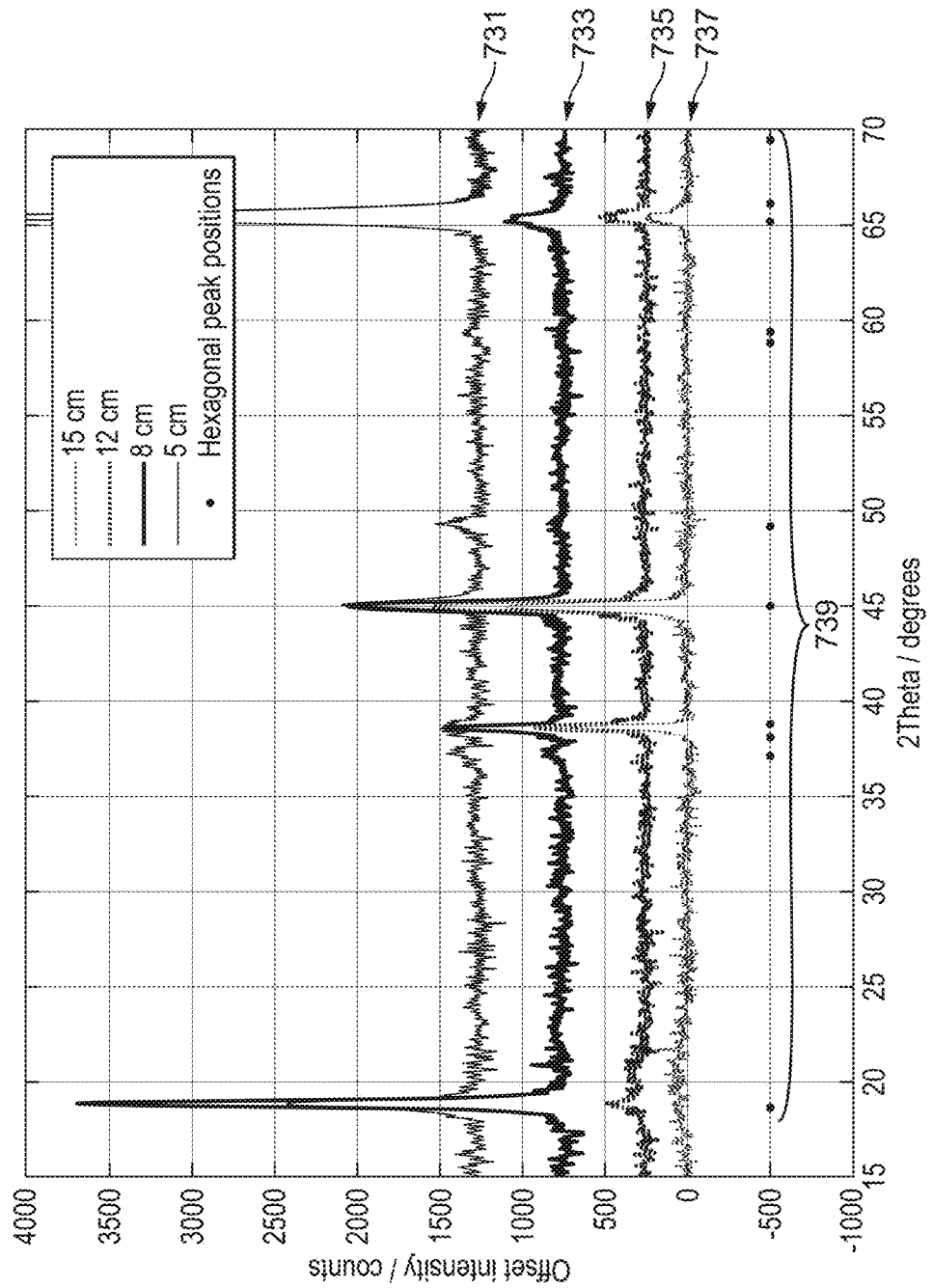
FIG. 8b shows a number of X-Ray diffraction spectra collected as part of the method of FIG. 8a, where the characterisation technique is X-Ray diffraction and the characteristic feature is a characteristic X-Ray diffraction peak associated with a layered oxide structure.

In this eighth example, the characterisation technique used is X-ray diffraction, and the characteristic property is a diffraction peak or series of diffraction peaks. FIG. 8b shows a number of X-Ray diffraction patterns recorded of films deposited at different working distances. From the top diffraction pattern to the bottom diffraction pattern the working distances were 5 cm (ref. no. 731), 8 cm (733), 12 cm (735) and 15 cm (737), respectively. As can be seen from the figure, a working distance of 8 cm shows the highest intensity peak 733 at 19 degrees 2theta (which is one of the required peak positions 739 for hexagonal $LiCoO_2$, this particular peak not being present in cubic or spinel structures of $LiCoO_2$). Therefore, in this example, 8 cm is chosen as the working distance. In other examples, a different characterisation technique may be used other than X-Ray diffraction. The intensity of the diffraction pattern 731 measured for a working distance of 5 cm is less intense at 19 degrees 2theta than the diffraction pattern 733 at a working distance of 8 cm. The diffraction patterns collected for a working distance of 12 cm 735 and 15 cm 737 do not show the characteristic peak for hexagonal $LiCoO_2$ at 19 degrees 2theta at all.

In some examples, the test specimens of the method are replaced with an average value for a number of test specimens, comprising a number of test specimens, wherein the method of the first example has been performed a number of times at the same working distance, and an average taken. In some examples the method may be performed a number of times such that a range of optimal working distances can be found for operating the system.

Figure 9A:
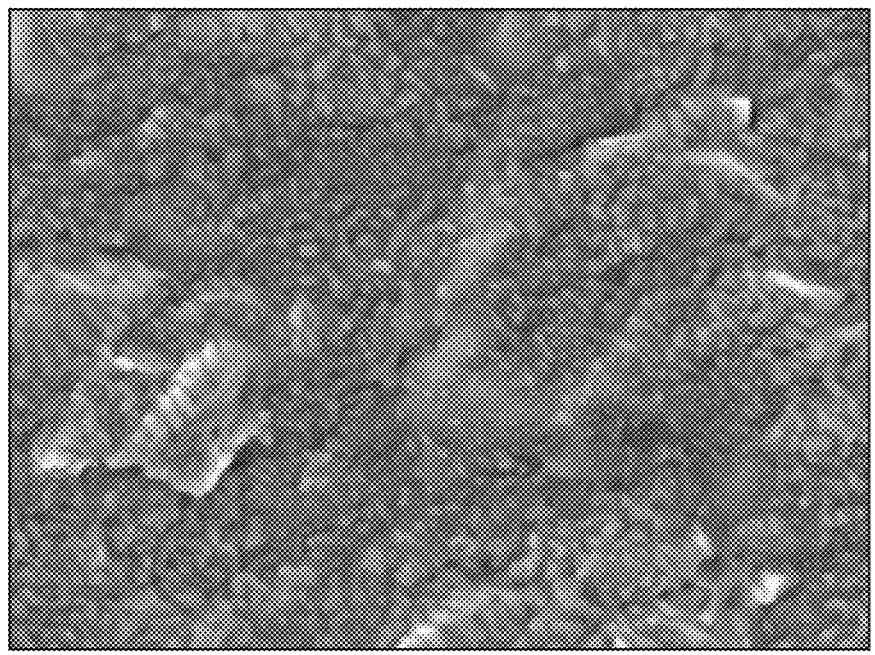
FIG. 9a is a micrograph of a sample film formed in accordance with the first example of the invention.
Figure 9B:
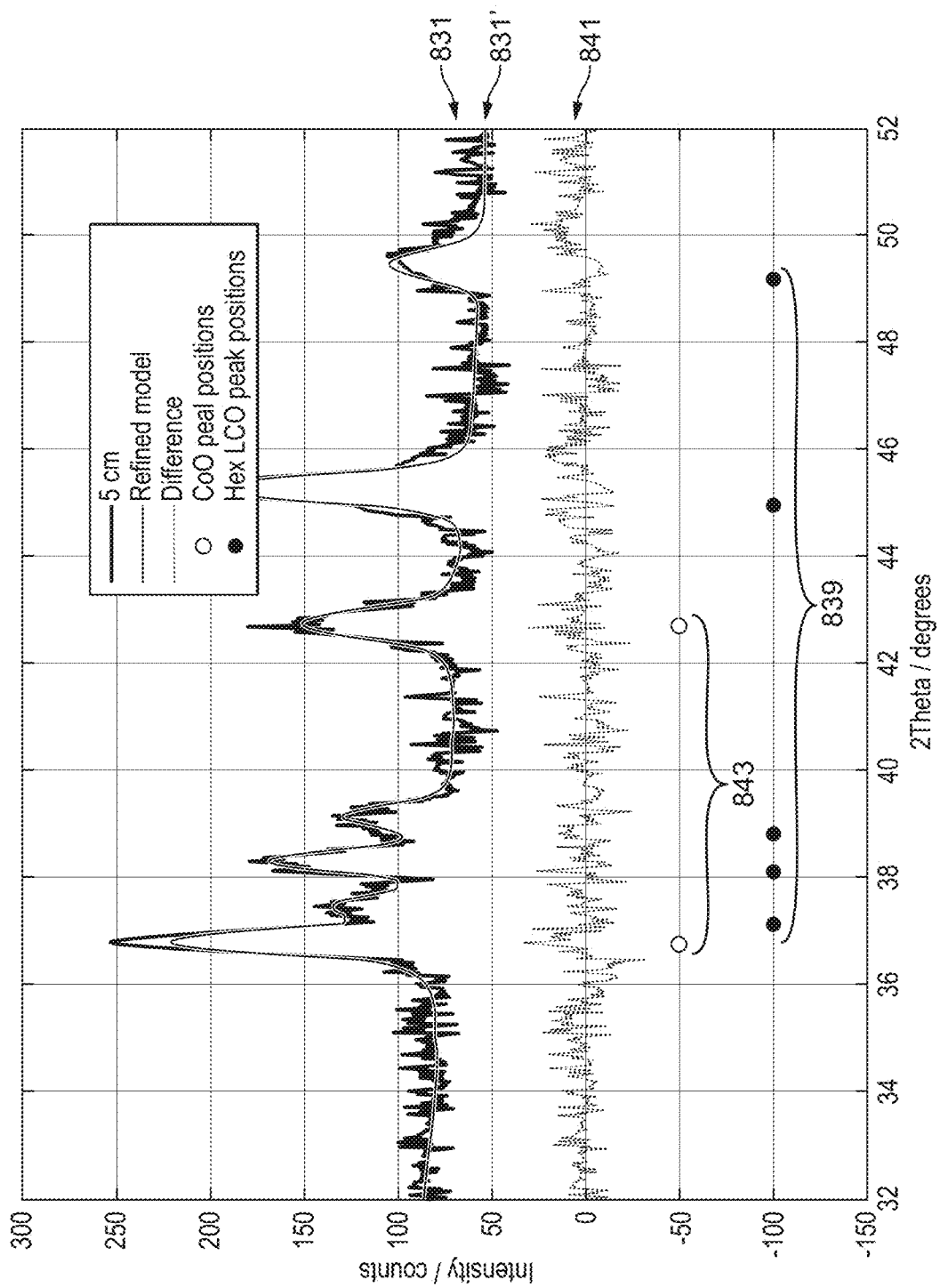

FIG. 9a shows a sample formed in accordance with the first example, during performing the method of the eighth example, and shows a damaged substrate surface (with undesirable oxides) which forms due to the deposition when the working distance is too short. In this example, the working distance was 5 cm, and the material deposited was LiCoO2. As can be seen from the figure, crystallites have not formed over the whole substrate surface, and deformation of the substrate can be seen. In addition, regions of Co(II)O, an undesirable phase of cobalt oxide, can be seen forming on the substrate at this working distance. This is confirmed by the spectra as shown in FIG. 9b, which shows peaks relating to Co(II)O phases (identified at two values 843 of 2theta) being detected in a diffraction pattern 831 obtained for a sample at which the working distance was 5 cm, in addition to hexagonal LCO, peaks (identified at 5 values 839 of 2theta). A structural refinement model 831' containing both hexagonal LiCoO2 and Co(II)O phases, was obtained from the collected diffraction pattern of 831. The difference between the diffraction pattern 831 and the refinement model 831' is illustrated by the difference line 841. Thus, during the method of the eighth example, overly short working distances cannot be selected as the optimum working distance.

Figure 10A:
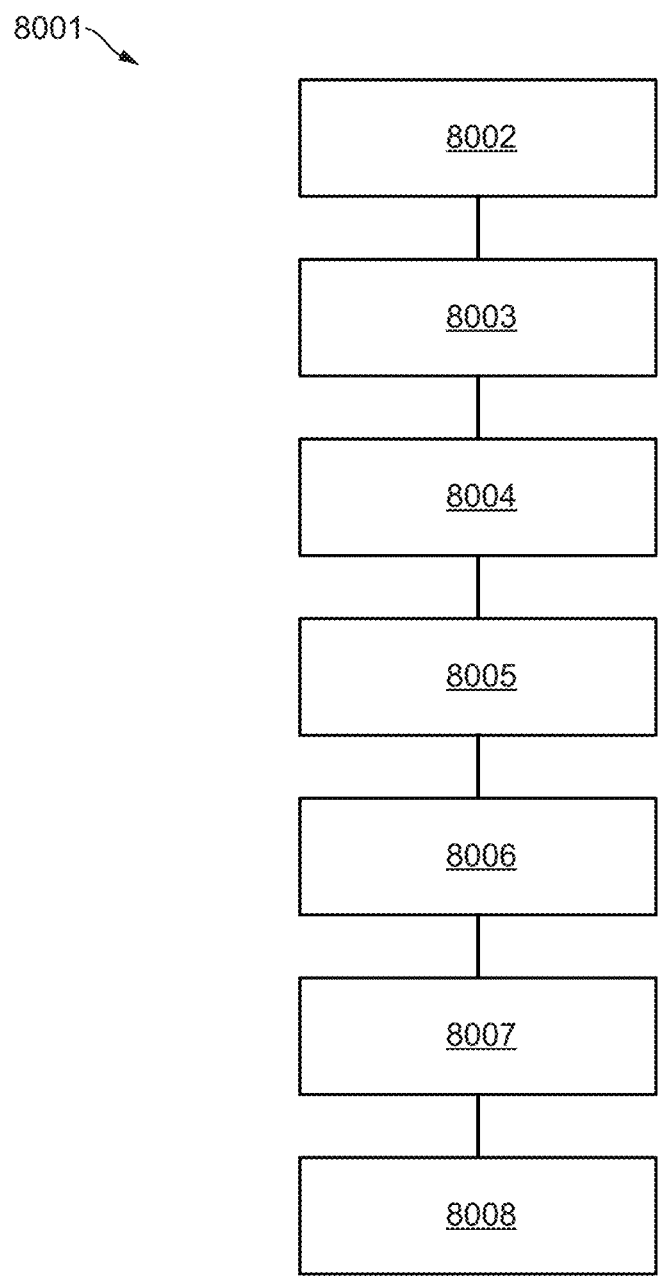
FIG. 10a a schematic representation of an example of a method of determining an optimum working pressure for a remote plasma deposition system configured for the deposition of layered oxide materials in accordance with a ninth example.

An example of a method of determining an optimum range of working pressures for a remote plasma deposition system configured for the deposition of layered oxide materials in accordance with a ninth example will now be described with reference to FIG. 10a. The method is generally described by numeral 8001 wherein the method comprises:

Selecting 8002 an initial range of working pressures, from 0.00065 mBar to 0.01 mBar (and optionally from 0.001 to 0.007mBar),
for a number of test specimens, for each respective specimen, performing 8003 the method of depositing material according to the first example at different working pressures within the selected range,
performing 8004 a characterisation technique capable of determining a characteristic property of a layered oxide structure on each of the test specimens after deposition has occurred,
selecting 8005 the test specimen which was deposited at the lowest working pressure from the group of test specimens which display a characteristic feature of a layered oxide material, and setting 8006 this working pressure as the lower bound of the range,
selecting 8007 the test specimen which was deposited at the highest working pressure from the group of test specimens which do not show observable signs of damage to the substrate, and setting 8008 this working pressure as the higher bound of the range.

Figure 10B:
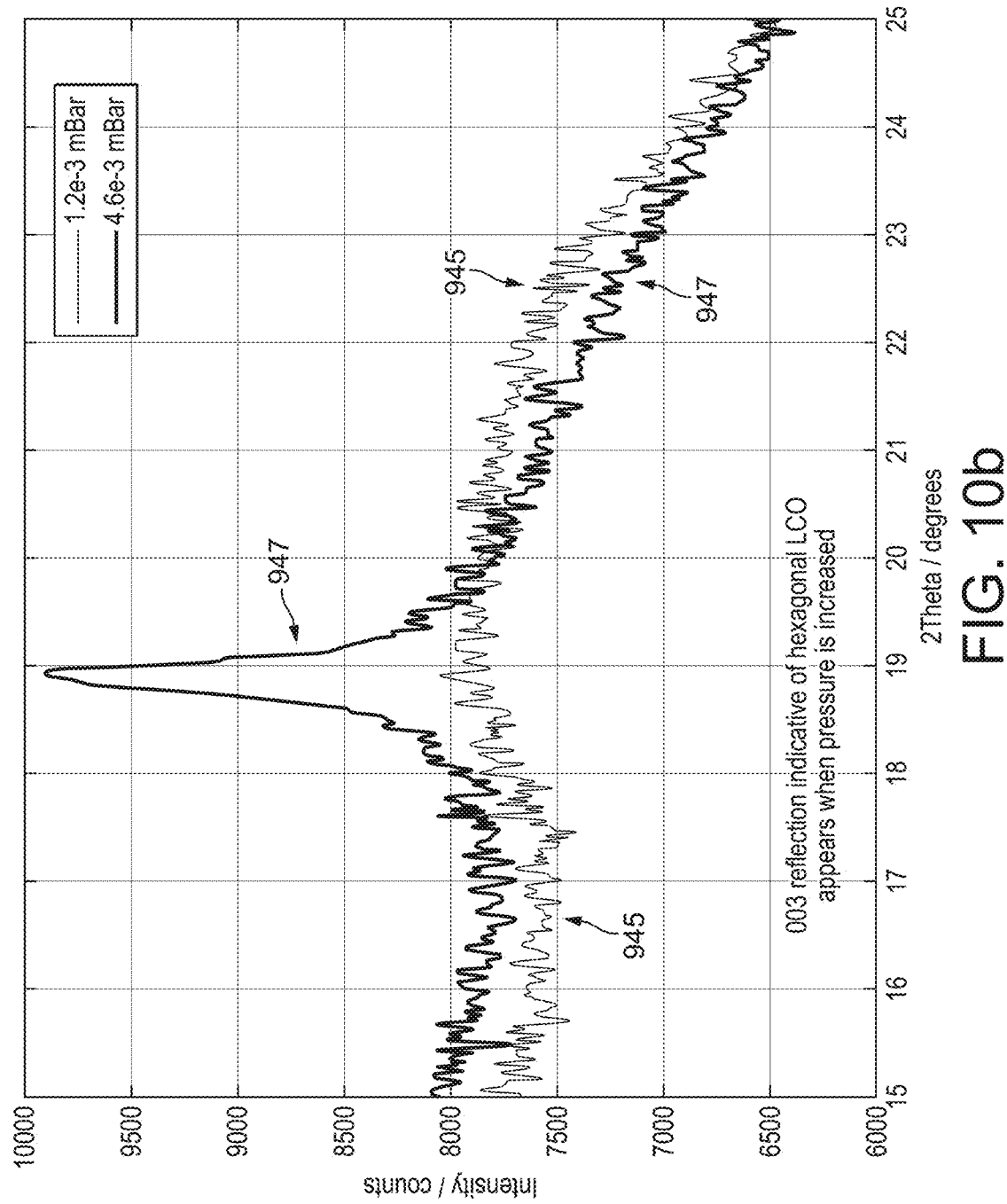
FIG. 10b shows two X-Ray diffraction spectra collected as part of the method as described with reference to FIG. 10a, where the characterisation technique is X-Ray diffraction and the characteristic feature is a characteristic X-Ray diffraction peak associated with a layered oxide structure.

In this ninth example, the characterisation technique used is X-ray diffraction, and the characteristic feature is a feature comprises a characteristic X-Ray diffraction peak of a layered oxide material. FIG. 10b shows an example X-Ray spectra showing how below a certain working pressure, this characteristic feature is not present. In this example, the presence of a peak at 19 degrees 2theta in the pattern 947 for the sample deposited at 0.0046mBar resulted in the formation of a hexagonal crystalline phase, whereas the pattern 945 for the sample deposited at 0.0012mBar did not lead to the formation of a hexagonal crystalline phase, as shown by the absence of the peak. In other examples, a characterisation technique may be used other than X-Ray diffraction.

In further examples, the test specimens of the method are replaced with an average value for a number of test specimens, comprising a number of test specimens wherein the method of the first example has been performed a number of times at the same working pressure, and an average taken.

In some examples, the method also comprises selecting the optimum working pressure of the system within the desired range. In this example, the optimum working pressure is the working pressure within the range that results in the highest deposition rate.

Figure 11A:
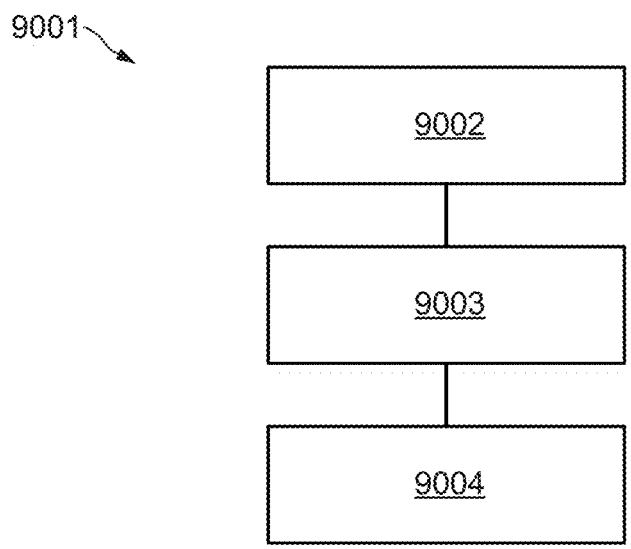
FIG. 11a is an example of the steps of a method of determining the crystallite size of layered oxide materials in accordance with a tenth example.

An example of a method of determining the crystallite size for deposition of layered oxide materials in accordance with a tenth example will now be described with reference to FIG. 11a. The method is generally described by numeral 9001 wherein the method comprises:

selecting 9002 an initial range of working pressures, from 0.00065 mBar and 0.01 mBar,
for a number of test specimens, for each respective specimen, performing 9003 the method of depositing material according to the first example at different working pressures within the selected range,
performing 9004 a characterisation technique capable of determining the crystallite size of each film for each of the test specimens after deposition has occurred, The selected range of working pressures may be from 0.001 to 0.007 mBar, for example.

Figure 11B:
FIG. 11b is a graph showing how to determine the crystallite size at different working pressures in accordance with the tenth example, for a working distance of 16 cm, showing the crystallite size for a number of films deposited in accordance with the first example.
Figure 11C:
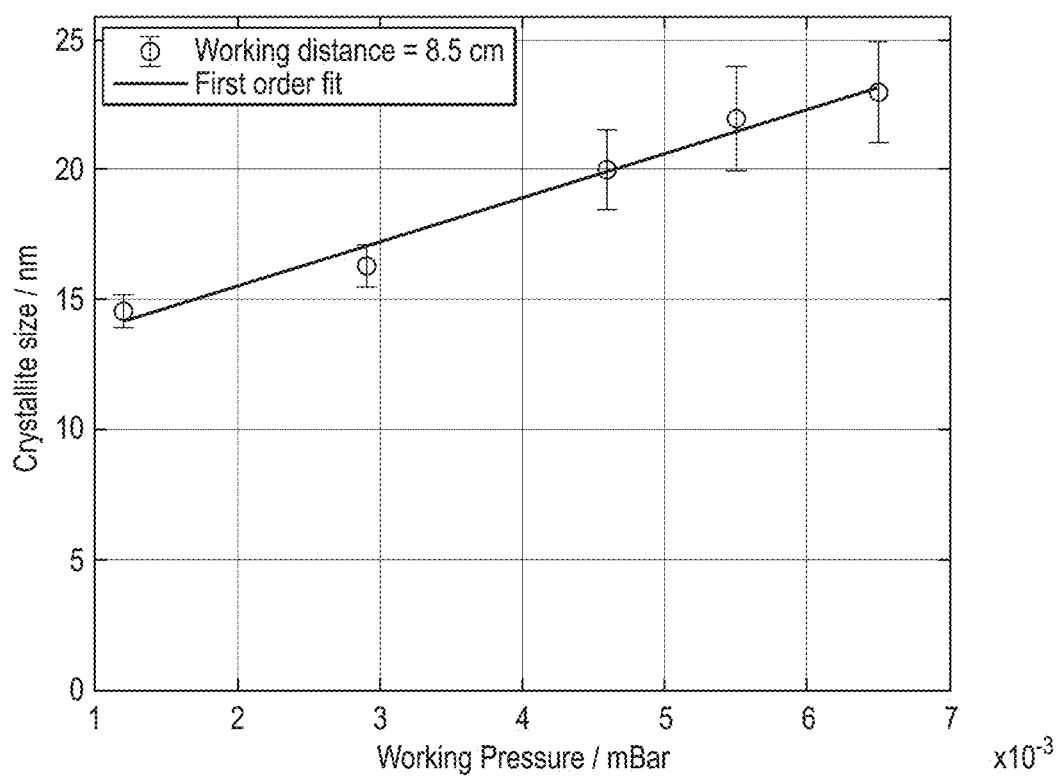
FIG. 11c is a graph showing how to determine the crystallite size at different working pressures in accordance with the tenth example, for a working distance of 8.5 cm, the crystallite size for a number of films deposited in accordance with the first example.

FIG. 11b is a graph showing, after performing the method of the tenth example over a given range of working pressures, for a working distance of 16 cm, that the range of crystallite size that forms for a number of films deposited in accordance with the first example at different working pressures between 0.001 mBar and 0.0065 mBar, is relatively broad in comparison to FIG. 11c.

FIG. 11c is a graph showing, after performing the method of the tenth example over a given range of working pressures, for a working distance of 8.5 cm, that the range of crystallite size that forms for a number of films deposited in accordance with the first example at different working pressures between 0.001 mBar and 0.0065 mBar is relatively narrow in comparison to FIG. 11b.

It is beneficial to have a narrow distribution of crystallite sizes, as this makes the crystallite size of films deposited on an industrial scale both predictable and repeatable.

Figure 12:
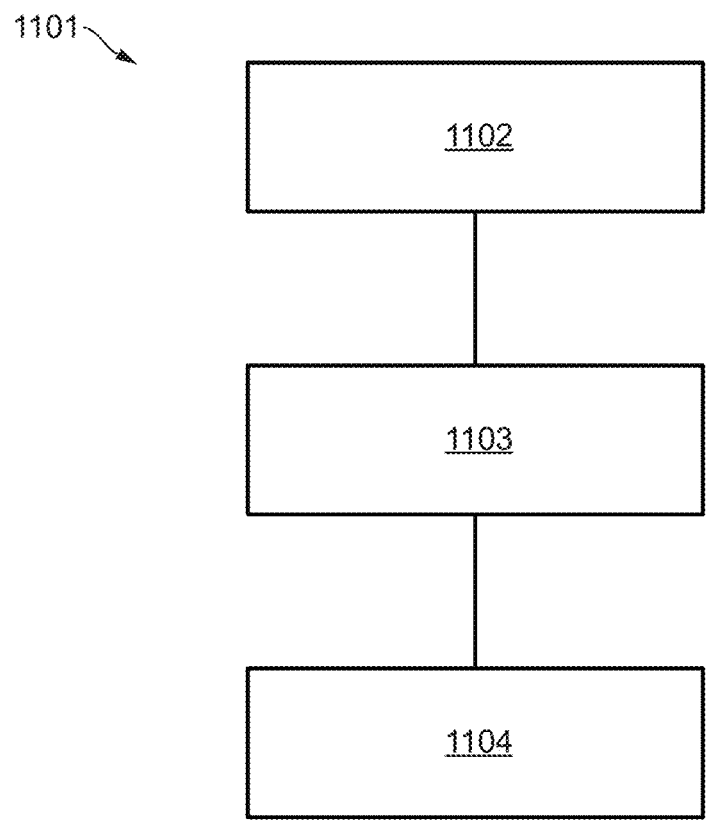
FIG. 12 is a schematic representation of a method of depositing a material on a substrate in accordance with an eleventh example of the invention.

An example of a method of depositing a material on a substrate in accordance with an eleventh example of an example will now be described with reference to FIG. 12. The method is generally described by numeral 1101 and comprises:

generating 1102 a plasma remote from a plasma target or targets suitable for plasma sputtering,
exposing 1103 the plasma target or targets to the plasma, thereby generating sputtered material from the target or targets,
depositing 1104 the sputtered material on a first portion of the substrate.

The method of depositing material on a substrate as described by the eleventh example comprises all of the features of the deposition of the first example, although in this example, the target material may be any material. In this example, the target material is crystalline, however in other examples the deposited material may take a semi-crystalline form, or be amorphous.

Figure 13:
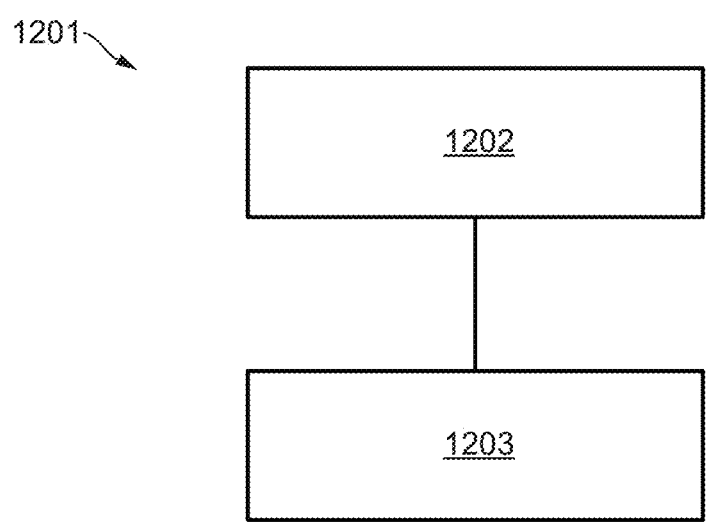
FIG. 13 is a schematic representation of an example of a method of manufacturing a component for an electronic device in accordance with a twelfth example.

Also presented is a twelfth example, which relates to a method of manufacturing a component for an electronic device comprising a substrate, which will now be described with reference to FIG. 13. The method is generally described by numeral 1201 and comprises depositing 1202 a material onto the substrate using a method of the as described in the eleventh example. The method of the eleventh example in this example is performed a plurality of times 1203 in order to deposit multiple layers. In this example, at least some of the multiple layers may are semi-conducting layers. In this example, the method is therefore a method of manufacturing a semi-conducting device or part thereof. In this example adjacent layers are be deposited with differing parameters and/or target materials used for the deposition of each layer, in order to produce an electronic device. In other examples, multiple layers of a plurality of layers of material are deposited with substantially the same target materials and parameters.

In this example, the substrate comprises one intermediate layer, which may optionally act as a current collecting layer. In other examples, there are more intermediate layers, which help with adhesion during deposition steps. In some other examples, there is no intermediate layer. The deposition of the intermediate layer onto the substrate is be performed in accordance with the method as described in the eleventh example. In other examples, deposition of the intermediate layer onto the substrate is performed by another appropriate deposition technology such as sputtering, thermal evaporation, electron beam evaporation, pulsed laser deposition, or other thin film deposition technology.

In this example, the method comprises depositing a first semiconducting layer of material. In this example, the first semiconducting layer is deposited onto an intermediate layer of material. In other examples, the first semiconducting layer is deposited directly onto the substrate. In this example, the first semiconducting layer comprises silicon. In other examples, the first semiconducting layer comprises aluminium, and in some further examples, gallium nitride. In examples where the semiconducting layer of material is gallium nitride, the deposition occurs under a reactive nitrogen atmosphere. In this example, the first semiconducting layer of material is doped n-type. This is achieved in this example by sputtering of a target comprising a compound containing phosphorous. In other examples, this is achieved by use of a different dopant such as arsenic, antimony, bismuth or lithium. In some further examples, the semiconducting layer of material is doped p-type, with dopants such as boron, aluminium, gallium or indium. In further examples, the semiconducting layer of material is not doped, and is an intrinsic semi-conductor. In some of these examples, the dopant material is not introduced as a target which can be sputtered, and is instead introduced as a gas after deposition, such that the dopant diffuses into the surface of the semiconducting layer.

In this example, the method comprises depositing a second semiconducting layer of material, onto the first semiconducting layer of material. In other examples, the second semi-conducting layer of material is deposited directly onto the substrate or the intermediate layer (if present). In this example, the second semiconducting layer of material is an intrinsic semiconductor. In this example, the second semi-conducting layer of material is gallium nitride. In further examples, the second semiconducting layer of material is doped n-type with dopants such as phosphorous, arsenic, antimony, bismuth or lithium. In some further examples, the second semiconducting layer of material is doped p-type, with dopants such as boron, aluminium, gallium or indium. In some of these examples, the dopant material is not introduced as a target that can be sputtered, and is instead introduced as a gas after deposition, such that the dopant diffuses into the surface of the semiconducting layer.

In this example, the method comprises depositing a third semiconducting layer of material. In this example, the third semiconducting layer is deposited onto the second semiconducting layer of material. In other examples, the third semiconducting layer is deposited directly onto the first semiconducting layer, second semiconducting layer, the intermediate layer or the substrate. In this example, the third semiconducting layer comprises silicon. In other examples, the third semiconducting layer comprises aluminium, and in some further examples, gallium nitride. In some examples where the semiconducting layer of material is gallium nitride, the deposition occurs under a reactive nitrogen atmosphere. In this example, the third semiconducting layer of material is doped p-type. This is achieved in this example by sputtering of a target comprising a compound containing boron. In other examples, this is achieved by use of a different dopant such as aluminium, gallium or indium. In some further examples, the third semiconducting layer of material is doped n-type, with dopants such as phosphorus, arsenic, antimony, bismuth or lithium. In further examples, the third semiconducting layer of material is not doped, and is an intrinsic semi-conductor. In some of these examples, the dopant material is not introduced as a target, which can be sputtered, and is instead introduced as a gas after deposition, such that the dopant diffuses into the surface of the semiconducting layer.

The method of this example may therefore be used to form a p-n or p-i-n junction.

In this example, no further dopants are introduced into some of the semiconducting layers hitherto described. In some examples, germanium is introduced as a dopant in the first, second and/or third layers. Germanium alters the band gap of the electronic device, and improves the mechanical properties of each semiconducting layer of material. In some examples, nitrogen is introduced as a dopant in the first, second and/or third layers of material. Nitrogen is used to improve the mechanical properties of the semiconducting layers formed.

Figure 14:
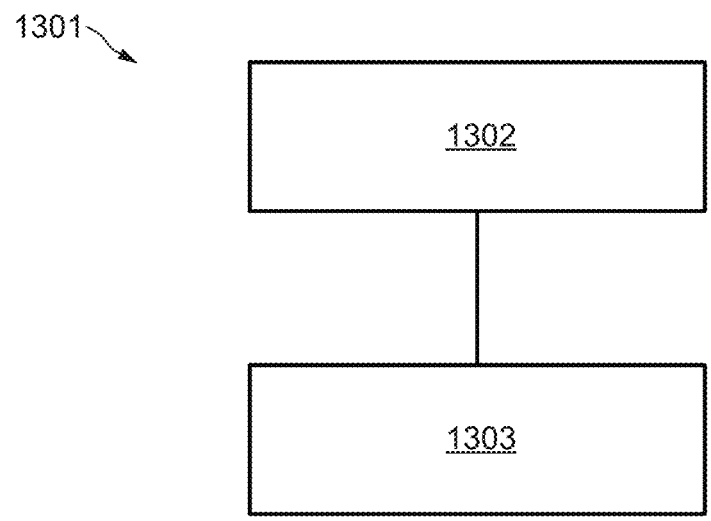
FIG. 14 is a schematic representation of an example of a method of manufacturing a component for an electronic device, in accordance with the thirteenth example of the invention.

Also presented is a thirteenth example, which relates to a method of manufacturing a crystalline layer of Yttrium Aluminium Garnet (YAG), which will now be described with reference to FIG. 14. The method is generally described by numeral 1301 and comprises using the method as described in the eleventh example 1302, wherein the YAG is doped 1303 with at least one f-block transition metal.

In this example, the dopant material is a lanthanide.

In this example, the dopant material comprises neodymium. In other examples, the dopant material comprises chromium or cerium in addition to neodymium. In this example, the crystalline layer of material comprises 1.0 molar percent neodymium. In some examples, the material also comprises 0.5 molar percent cerium.

In yet further examples, the dopant material comprises erbium. In this example, the dopant material is provided as a target, and sputtered as described in the eleventh example. The crystalline layer of material in this further example comprises 40 molar percent erbium. In one example, the crystalline layer of material comprises 55 percent erbium.

In yet further examples, the dopant material comprises ytterbium. In one of these examples, the crystalline layer of material comprises 15 molar percent ytterbium.

In yet further examples, the dopant material comprises thulium. In further examples, the dopant material comprises dysprosium. In further examples, the dopant material comprises samarium. In further examples, the dopant material comprises terbium.

In yet further examples, the dopant material comprises cerium. In some examples where the dopant material comprises cerium, the dopant material also comprises gadolinium.

In some examples, instead of the dopant material being provided as a distinct region of a target or targets, the dopant material is, at least in part, introduced after the deposition of the layer of crystalline material, by providing the dopant material as a gas, such that it diffuses into the layer of crystalline material.

Figure 15:
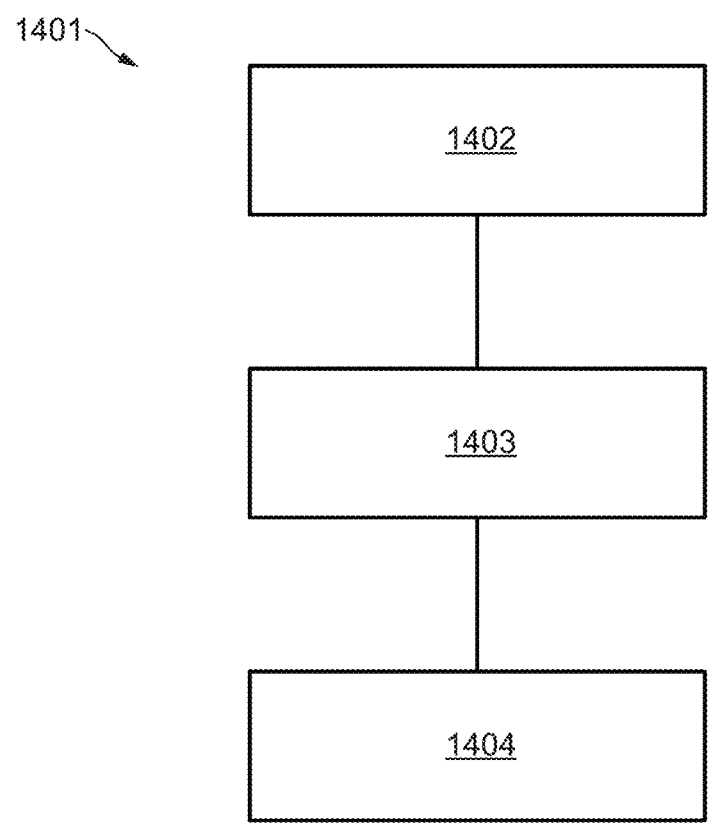
FIG. 15 is a schematic representation of an example of a method of manufacturing a Light Emitting Diode (LED) in accordance with a fourteenth example of the invention.

According to a fourteenth example, a method of manufacturing a light emitting diode is presented, which will now be described with reference to FIG. 15.

The method is generally described by numeral 1401 and comprises performing the method according to the twelfth example 1402, and thereafter or therein performing the method according to the thirteenth example 1403, in the case where the dopant used during the method of the thirteenth example comprises cerium 1404. The layer of cerium-doped YAG is used as a scintillator in an LED in this example.

The methods according to the twelfth and thirteenth examples may be performed inside the same process chamber.

Figure 16:
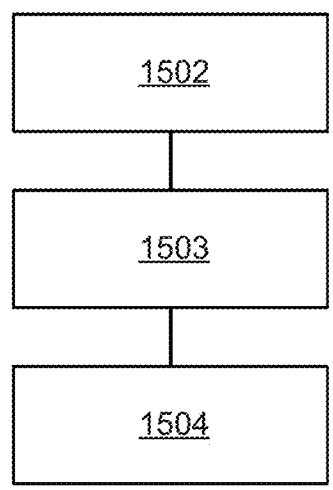
FIG. 16 is a schematic representation of an example of a method of manufacturing a permanent magnet in accordance with a fifteenth example of the invention.

According to a fifteenth example, a method of manufacturing a permanent magnet is presented, which will now be described with reference to FIG. 16. The method is generally described by numeral 1501 and comprises comprising performing the method according to the eleventh example 1502, wherein the distinct regions of the target or targets provided comprise neodymium, iron, boron and dysprosium 1503, and the method comprises processing the film 1504 such that the layer of material becomes a permanent magnet.

In this example, the final layer of material comprises 6.0 molar percent dysprosium. In further examples, the molar percentage of dysprosium is less than 6.0.

The high target utilisation that the current method provides is beneficial when constructing electronic devices from rare elements such as dysprosium.

Dysprosium is available in limited Earth abundancy, and so a deposition system with a high target utilisation results in less material waste.

Figure 17:
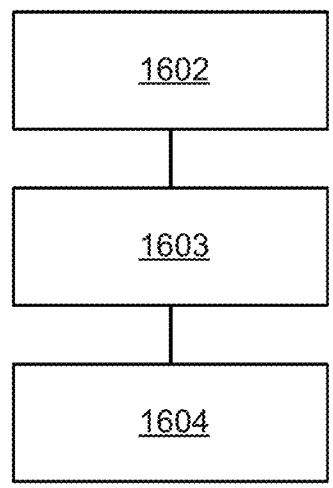
FIG. 17 is a schematic representation of an example of a method of manufacturing an electronic device comprising a layer of Indium Tin Oxide (ITO) in accordance with a sixteenth example of the invention.

According to a sixteenth example, a method of manufacturing a layer of Indium Tin Oxide (ITO) is presented, which will now be described with reference to FIG. 17. The method is generally described by numeral 1601 and comprises performing the method according to the eleventh example 1602, wherein the distinct regions of the targets provided comprise indium and tin 1603. The layer of ITO is deposited in such a way that it directly forms a transparent crystalline layer of material on deposition 1604 onto the substrate. In other examples, a composite target is used, which comprises both indium and tin. In yet further examples, the composite target comprises an oxide of indium and tin. The number of targets used thus may differ in further examples, and a single target may be used.

In yet further examples the targets may comprise an oxide of indium, or an oxide of tin. The deposition process in further examples comprises providing oxygen, such that the sputtered material from the targets reacts with the oxygen in order to form Indium Tin Oxide on the substrate.

According to a seventeenth example, not separately illustrated, a method of manufacturing a photovoltaic cell is presented. In this example, the method further comprises the deposition of an ITO, as described in the fifteenth example. In further examples, no layer of ITO is deposited. In this example, the method also comprises the deposition of a layer of perovskite material in between a n-type doped layer of semiconducting material and a p-type doped layer of semiconducting material. The perovskite layer of material is in this case deposited as described by the method of the eleventh example. In further examples, it is deposited by another suitable means such as physical vapour deposition, or wet chemistry techniques. In further examples, no perovskite layer of material is deposited.

In alternative examples, the method comprises the deposition of a layer of copper indium gallium selenide in accordance with the eleventh example. The copper, indium, gallium, and selenide is provided as distinct regions of the target or targets. In this example the copper is provided as an elemental target, and the indium, gallium, and selenide are provided as oxide targets. Other combinations of oxide, elemental, compound or composite targets are used in further examples. The number of targets used thus may differ in further examples, and a single target may be used.

In some examples, the method comprises the deposition of a layer of cadmium sulphide in accordance with the eleventh example. In this example, the cadmium and sulphide are provided as distinct regions of the targets in oxide form. Other combinations of oxide, elemental, compound or composite targets are used in further examples. The number of targets used thus may differ in further examples, and a single target may be used.

In some examples, the method comprises deposition of a layer of cadmium telluride in accordance with the eleventh example. The cadmium and telluride is provided as distinct regions of elemental targets in tis example. In other examples, the cadmium and telluride is provided as distinct regions of the target or targets in elemental, an oxide, a composite or any combination thereof. The number of targets used thus may differ in further examples, and a single target may be used.

Whilst the forgoing description has been described and illustrated with reference to particular examples, it will be appreciated by those of ordinary skill in the art that the invention lends itself to many different variations not specifically illustrated herein. By way of example only, certain possible variations will now be described.

Where in the foregoing description, integers or elements are mentioned which have known, obvious or foreseeable equivalents, then such equivalents are herein incorporated as if individually set forth. Reference should be made to the claims for determining the true scope of the example, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

The invention claimed is:

1. A method of manufacturing a layer of cathode, the method comprising:
   providing a substrate, wherein the substrate is in a form of a continuous flexible web, and comprises a polymer;
   generating a plasma remote from one or more cathode material sputter targets;
   confining the plasma in a space between the substrate and the one or more cathode material sputter targets;
   controlling a sputter rate from the one or more cathode material sputter targets by curving a geometric surface of the plasma at a location substantially near to the one or more targets;
   generating sputtered material from the target using the plasma; and
   depositing sputtered material on the substrate, thereby forming a layer of crystalline cathode on the substrate.

2. The method according to claim 1, further comprising moving the substrate, and depositing a layer of crystalline cathode onto the moving substrate.

3. The method according to claim 1, wherein the polymer is polyethylene terephthalate (PET) or polyethylene naphthalate (PEN).

4. The method according to claim 3, wherein a first portion of the continuous flexible web that is upstream of the plasma deposition process is held on an upstream roller or drum, and a second portion of the continuous flexible web that is downstream of the plasma deposition process is held on a downstream roller or drum.

5. The method according to claim 1, in which the substrate does not exceed its temperature corrected yield strength.

6. The method according to claim 4, in which the substrate does not exceed its temperature corrected yield strength as it passes from the upstream roller or drum to the downstream roller or drum.

7. The method according to claim 1, wherein the cathode material comprises one or more alkali metals, one or more transition metals, and optionally aluminium.

8. The method according to claim 7, wherein the cathode material comprises lithium and one or more transition metal, each selected from the group consisting of Co, Ni and Mn.

9. The method according to claim 1, in which the maximum temperature reached at any given time by any given square of substrate material having an area of 1 cm$^2$ as measured on the surface opposite to said surface on which the material is deposited and as averaged over a period of 1 second, is less than 200 degrees C.

10. The method according to claim 1, in which one or more target(s) comprises the cathode material.

11. The method according to claim 1, in which the thickness of the deposited cathode material on completion of deposition is no more than 10 microns.

12. The method according to claim 1, in which the thickness of the substrate is no more than 1.6 microns.

13. The method according to claim 1, in which the power density associated with the bias applied to at least one target is at least 1.0 Wcm$^{-2}$.

14. The method according to claim 1, in which the power density associated with the bias applied to the target is up to 100 Wcm$^{-2}$.

15. The method according to claim 1, in which the ratio of the power supplied to generate the remote plasma to the power associated with the bias of the target is more than 1:1.

16. The method according to claim 15, in which the ratio of the power supplied to generate the remote plasma to the power associated with the bias of the target is no more than 7:2.

17. The method according to claim 1, wherein the working distance between the target and the substrate may be within +/−50% of the theoretical mean free path of the system.

18. The method according to claim 1, wherein the working pressure is from 0.00065 mBar to 0.02 mBar.

19. The method according to claim 1, in which the substrate comprises a current collecting layer.

20. A method of manufacturing a cathodic half-cell of a battery, the method comprising: making a battery cathode for a solid state battery using the method according to claim 1; and depositing electrolyte onto said battery cathode.

21. A method of making a solid state battery cell, the method comprising making a cathodic half cell in accordance with the method of claim 20; and contacting said cathodic half cell with an anode or depositing anode-forming material on the electrolyte.

22. A method of making a solid state battery comprising a plurality of solid state battery cells, the method comprising: making a plurality of solid state battery cells in accordance with the method of claim 21.

* * * * *